(12) United States Patent
Clampitt et al.

(10) Patent No.: US 6,551,878 B2
(45) Date of Patent: Apr. 22, 2003

(54) MINI FLASH PROCESS AND CIRCUIT

(75) Inventors: Darwin A. Clampitt, Boise, ID (US); James E. Green, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/757,878

(22) Filed: Jan. 9, 2001

(65) Prior Publication Data

US 2001/0001720 A1 May 24, 2001

Related U.S. Application Data

(62) Division of application No. 09/146,298, filed on Sep. 3, 1998, now Pat. No. 6,191,444.

(51) Int. Cl.[7] .................... H01L 21/336; H01L 21/8238

(52) U.S. Cl. ................... 438/258; 438/211; 438/257; 438/266

(58) Field of Search ................... 438/211, 258, 438/257, 264, 266, 620, 586

(56) References Cited

U.S. PATENT DOCUMENTS

| | | | |
|---|---|---|---|
| 4,866,669 A | 9/1989 | Srour et al. .................. 365/176 |
| 5,089,867 A | 2/1992 | Lee et al. .................. 357/23.5 |
| 5,136,190 A | 8/1992 | Chern et al. ................. 307/475 |
| 5,149,665 A | 9/1992 | Lee .............................. 437/43 |
| 5,175,120 A | 12/1992 | Lee .............................. 437/48 |
| 5,188,976 A | * 2/1993 | Kume et al. ................. 438/258 |
| 5,192,872 A | 3/1993 | Lee ............................ 257/315 |
| 5,223,451 A | * 6/1993 | Uemura et al. ............. 257/314 |
| 5,235,545 A | 8/1993 | McLaury ............... 365/189.04 |
| 5,239,196 A | 8/1993 | Ikeda et al. ................. 257/385 |
| 5,241,202 A | 8/1993 | Lee ............................ 257/315 |
| 5,246,537 A | * 9/1993 | Cooper et al. .............. 156/649 |
| 5,254,489 A | 10/1993 | Nakata ........................ 437/40 |
| 5,260,593 A | 11/1993 | Lee ............................ 257/316 |
| 5,281,548 A | 1/1994 | Prall ........................... 437/43 |
| 5,297,082 A | 3/1994 | Lee ............................ 365/185 |
| 5,305,263 A | 4/1994 | Morgan ....................... 365/190 |
| 5,311,478 A | 5/1994 | Zagar et al. ........... 365/230.06 |
| 5,313,433 A | 5/1994 | Waller ................... 365/230.06 |
| 5,345,104 A | 9/1994 | Prall et al. .................. 257/607 |
| 5,360,751 A | 11/1994 | Lee ............................. 437/35 |
| 5,362,685 A | * 11/1994 | Gardner et al. ............. 438/264 |
| 5,389,581 A | 2/1995 | Freiberger et al. .......... 437/238 |
| 5,432,110 A | 7/1995 | Inoue ......................... 438/151 |
| 5,439,838 A | * 8/1995 | Yang .......................... 257/316 |
| 5,444,279 A | 8/1995 | Lee ............................ 257/316 |
| 5,506,811 A | 4/1996 | McLaury .................... 365/233 |
| 5,510,284 A | 4/1996 | Yamauchi .................... 437/43 |
| 5,513,137 A | 4/1996 | Lee et al. .............. 365/185.09 |
| 5,559,742 A | 9/1996 | Lee et al. .................... 365/200 |
| 5,572,480 A | 11/1996 | Ikeda et al. ............ 365/230.06 |
| 5,580,807 A | 12/1996 | Sery et al. .................... 437/47 |
| 5,596,213 A | 1/1997 | Lee ............................ 257/316 |
| 5,600,602 A | 2/1997 | Syyedy ....................... 365/205 |
| 5,604,366 A | 2/1997 | Lee ............................ 257/316 |

(List continued on next page.)

*Primary Examiner*—Matthew Smith
*Assistant Examiner*—Lex H. Malsawma
(74) *Attorney, Agent, or Firm*—Schwegman, Lundberg, Woessner & Kluth, P.A.

(57) ABSTRACT

A method for making reduced-size FLASH EEPROM memory circuits, and to the resulting memory circuit. An FET integrated circuit having two different gate oxide thicknesses deposited at a single step, where a portion of the thickness of the thicker oxide is formed, that oxide is removed from the area of the chip to have the thinner oxide, then the rest of the thicker oxide is grown during the time that the thinner oxide is grown on the area of the chip to have the thinner oxide. Layers for the floating gate stacks are deposited. Trenches are etched in a first, and then a second perpendicular direction, and the perpendicular sides of the stacks are covered with vertical-plane nitride layers in two separate operations. Tungsten word lines and bit contacts are deposited. Aluminum-copper lines are deposited on the bit lines.

41 Claims, 21 Drawing Sheets

U.S. PATENT DOCUMENTS

| | | | | |
|---|---|---|---|---|
| 5,607,868 A | * | 3/1997 | Chida et al. | 438/258 |
| 5,620,615 A | | 4/1997 | Keller | 438/720 |
| 5,622,881 A | * | 4/1997 | Acocella et al. | 438/264 |
| 5,633,823 A | | 5/1997 | Lee | 365/185.29 |
| 5,635,416 A | * | 6/1997 | Chen et al. | 438/258 |
| 5,650,965 A | | 7/1997 | Lee | 365/185.29 |
| 5,650,967 A | | 7/1997 | Seibert | 365/185.33 |
| 5,652,457 A | | 7/1997 | Ikeda et al. | 257/380 |
| 5,654,933 A | | 8/1997 | McLaury | 36/230.005 |
| 5,656,836 A | | 8/1997 | Ikeda et al. | 257/305 |
| 5,657,266 A | | 8/1997 | McLaury | 365/149 |
| 5,657,287 A | | 8/1997 | McLaury et al. | 365/230.01 |
| 5,658,814 A | | 8/1997 | Lee | 428/588 |
| 5,659,518 A | | 8/1997 | McLaury | 365/230.05 |
| 5,661,054 A | | 8/1997 | Kauffam et al. | 438/257 |
| 5,673,730 A | | 10/1997 | Hamilton | 140/105 |
| 5,680,350 A | | 10/1997 | Lee | 365/185.24 |
| 5,693,971 A | | 12/1997 | Gonzalez | 257/314 |
| 5,700,704 A | | 12/1997 | Ikeda et al. | 437/52 |
| 5,707,898 A | | 1/1998 | Keller et al. | 438/265 |
| 5,712,500 A | | 1/1998 | Hsue et al. | 257/315 |
| 5,714,412 A | | 2/1998 | Liang et al. | 438/266 |
| 5,720,031 A | | 2/1998 | Lindsay | 395/183.18 |
| 5,721,441 A | | 2/1998 | Lee | 257/315 |
| 5,721,703 A | | 2/1998 | Habersetzer et al. | 365/185.23 |
| 5,751,040 A | | 5/1998 | Chen et al. | 257/332 |
| 5,766,992 A | | 6/1998 | Chou et al. | 438/241 |
| 5,792,681 A | | 8/1998 | Chang et al. | 438/210 |
| 5,814,850 A | * | 9/1998 | Iwasa | 257/296 |
| 5,850,092 A | * | 12/1998 | Cappalletti | 257/321 |
| 5,888,869 A | | 3/1999 | Cho et al. | 438/258 |
| 6,001,687 A | | 12/1999 | Chu et al. | 438/257 |
| 6,022,798 A | | 2/2000 | Sumi et al. | 438/637 |
| 6,023,085 A | | 2/2000 | Fang | 257/315 |
| 6,184,093 B1 | * | 2/2001 | Sung | 438/275 |
| 6,268,623 B1 | | 7/2001 | Madurawe et al. | 257/318 |
| 6,300,241 B1 | | 10/2001 | Moore et al. | 438/637 |

\* cited by examiner

MINI FLASH PROCESS AND CIRCUIT

This application is a Divisional of U.S. application Ser. No. 09/146,298, filed Sep. 3, 1998 now U.S. Pat. No. 6,191,444.

FIELD OF THE INVENTION

This invention relates to the field of computer memory circuits, and more specifically to a method for making reduced-size FLASH memory circuits, and to the resulting memory circuit.

BACKGROUND OF THE INVENTION

Electrically erasable and programmable read only memory (EEPROM) techniques also implement non-volatile memory on integrated circuits. EEPROMs can be electrically programmed, erased, and reprogrammed. EEPROM devices are useful as non-volatile memory units in computers and other systems. EEPROM circuits can also be used in chips whose primary function is not just memory, but includes other logical or computation functions. One technique of implementing an EEPROM is by use of a floating gate tunneling oxide (FLOTOX) transistor. To create a FLOTOX transistor, a field-effect transistor (FET) having source, drain, substrate, and gate terminals is modified to electrically isolate (float) the gate. This polycrystalline silicon ("polysilicon" or "poly") floating gate is created over a thin insulating layer of silicon dioxide (tunnel oxide). A second polysilicon gate (control gate) is created above the floating gate. The floating gate and control gate are separated by an interpoly insulating layer. Since the floating gate is electrically isolated, any charge stored on the floating gate is trapped. Storing sufficient charge on the floating gate will create an inversion channel between source and drain of the FET. Thus, the presence or absence of charge on the floating gate can represent two distinct data values.

FLOTOX transistors are selectively programmed by transferring electronic charges through the thin gate oxide onto the floating gate by Fowler-Nordheim tunneling. With the substrate voltage held at ground, the control gate is raised to a sufficiently high positive voltage so that electrons are transferred from the substrate to the floating gate by tunneling through the insulating thin gate oxide. The tunneling process is reversible. The floating gate can be erased by grounding the control gate and raising the drain voltage to a sufficiently high positive voltage to transfer electrons out of the floating gate to the drain terminal of the transistor by tunneling through the insulating gate oxide. The voltage applied to the control gate during programming is higher than the voltage applied to the drain during erasure because, while the erasure voltage is applied directly across the gate oxide, the programming voltage is applied to the control gate and capacitively coupled onto the floating gate.

The transistors can be selectively reprogrammed in the same manner as described above, since the tunneling process is nondestructive. The programming and erasure voltages which effect Fowler-Nordheim tunneling are higher than the voltages normally used in reading the memory. The Fowler-Nordheim tunneling effect is negligible at the lower voltages used in reading the memory, allowing a FLOTOX transistor to maintain its programmed state for years if subjected only to normal read cycles.

Since reprogrammable non-volatile memory is useful for DRAM die identification and reconfiguring and remapping defective DRAM memory cells, it is desired to implement EEPROM through floating gate transistor structures which are compatible with existing DRAM processing steps.

U.S. Pat. No. 5,723,375 assigned to the assignee of the present invention (and incorporated herein by reference) describes a floating-gate memory cell that can be used in a DRAM or EEPROM.

Other convention fabrication techniques yield circuits having relatively large EEPROM memory cell areas. What is needed is a circuit which has an EEPROM memory cell area having a reduced area, and a method for producing such a circuit. What is also needed is a circuit having two or more different gate-oxide thicknesses, and a method for producing such a circuit.

SUMMARY OF THE INVENTION

The present invention provides an electronic circuit that includes a first set of one or more transistors each having a gate dielectric of a first thickness, and a second set of one or more transistors each having a gate dielectric of a second thickness different than the first thickness. In one embodiment, the circuit provides non-volatile EEPROM data storage.

In one embodiment, the first thickness is thicker than the second thickness. An initial thickness of dielectric is grown on both a first chip area for the first set of transistors and a second chip area for the second set of transistors. The dielectric is then removed from only the second chip area. Then a first and second final thickness of dielectric is grown on the first and second chip areas, respectively. Thus two distinct thicknesses of dielectric are provided.

In one such embodiment, the first and second chip areas are substantially co-planar. For example, a gate oxide is grown on a substrate to two distinct thicknesses.

In another such embodiment, the gate dielectric of the second thickness is an oxide layer sufficiently thin to allow Fowler-Nordheim tunneling for programming or erasing, and is covered by a polysilicon floating gate, a polysilicon control gate, and an electrical insulator layer separating the polysilicon floating gate and the polysilicon control gate. In one such embodiment, the gate dielectric of the first thickness is a gate oxide sufficiently thick to prevent electrical breakdown at operating voltages, and is covered by a polysilicon transistor gate that was deposited during the step that deposited the polysilicon floating gate.

One embodiment further includes a floating-gate poly layer over the second dielectric layer, an inter-poly nitride layer over the floating-gate poly layer, a control-gate poly layer over the inter-poly nitride layer, and a tungsten-silicide (WSix) layer over the control-gate poly layer.

In one such embodiment, the second dielectric layer, the floating-gate poly layer, the inter-poly nitride layer, the control-gate poly layer, and the tungsten-silicide (WSix) layer form a floating-gate stack on a silicon substrate. The stack is by a first side that extends into a first trench and a second side that extends into a second trench into the silicon substrate, and a drain end and a source end. The circuit further includes a nitride layer covering the first side from the inter-poly nitride layer to the first trench, a nitride layer covering the second side from the inter-poly nitride layer to the second trench, a nitride layer covering the drain end from the inter-poly nitride layer to the substrate, and a nitride layer covering the source end from the inter-poly nitride layer to the substrate.

Another embodiment further includes a tungsten drain contact formed substantially adjacent to the nitride layer covering the drain end, a tungsten source contact formed substantially adjacent to the nitride layer covering the source end, and a tungsten gate contact formed to substantially contact the WSix layer. In one such embodiment, an aluminum-copper (AlCu) line is formed substantially in contact with the tungsten drain contact.

Another aspect of the present invention provides a method for fabricating an electronic circuit. The method includes forming a first dielectric layer on both a first chip area to be used for a first set of transistors and on a second chip area to be used for a second set of transistors, removing the first dielectric layer from the second chip area but not from the first chip area; and forming a second dielectric layer on both the first chip area to be used for the first set of transistors and on the second chip area to be used for the second set of transistors.

In one such embodiment, the first dielectric layer is thicker than the second dielectric layer, and wherein the first dielectric is a gate oxide for signal transistors, and the second dielectric is a gate oxide for memory-cell storage transistors. In another such embodiment, the first and second chip areas are substantially co-planar. In still another embodiment, the second dielectric layer is a gate oxide sufficiently thin to allow Fowler-Nordheim tunneling for programming or erasing. In yet another embodiment, the first dielectric layer is a gate oxide sufficiently thick to prevent electrical breakdown at operating voltages, and is covered by a polysilicon transistor gate that was deposited during the step that deposited the polysilicon floating gate.

In one such embodiment, the method also includes depositing a floating-gate poly layer over the second dielectric layer, depositing an inter-poly nitride layer over the floating-gate poly layer, depositing a control-gate poly layer over the inter-poly nitride layer, and depositing a tungsten-silicide (WSix) layer over the control-gate poly layer.

In another such embodiment, the method also includes etching trenches to define a floating-gate stack on a silicon substrate, the stack having a first side that extends into a first trench and a second side that extends into a second trench into the silicon substrate, the stack including the second dielectric layer, the floating-gate poly layer, the inter-poly nitride layer, the control-gate poly layer, and the tungsten-silicide (WSix) layer, etching the stack to form a drain end and a source end, depositing a nitride layer covering the first side from the inter-poly nitride layer to the first trench, depositing a nitride layer covering the second side from the inter-poly nitride layer to the second trench; depositing a nitride layer covering the drain end from the inter-poly nitride layer to the substrate, and depositing a nitride layer covering the source end from the inter-poly nitride layer to the substrate.

In yet another such embodiment, the method also includes forming a tungsten drain contact substantially adjacent to the nitride layer covering the drain end, forming a tungsten source contact substantially adjacent to the nitride layer covering the source end, and forming a tungsten gate contact to substantially contact the WSix layer. In one such embodiment, the method also includes forming an aluminum-copper (AlCu) line substantially in contact with the tungsten drain contact.

Still another aspect of the present invention provides a method for fabricating an electronic circuit. This circuit has a substrate and a floating-gate stack on the substrate. The stack includes a gate oxide on the substrate and at least one poly layer on the gate oxide. This method includes etching a plurality of trenches through the stack and depositing a nitride spacer layer on sides of the trenches.

In one embodiment, the nitride spacer layer is deposited to isolate all sides of a floating gate poly layer. In another embodiment, a first plurality of substantially parallel trenches are etched through the stack into the substrate, the nitride spacer layer is deposited on sides of the first plurality of parallel trenches, then a second plurality of substantially parallel trenches are etched substantially perpendicular to the first plurality of substantially parallel trenches and then the nitride spacer layer is deposited on sides of the second plurality of parallel trenches.

In one embodiment, the stack includes two poly layers separated by an inter-poly dielectric layer, and the nitride spacer layer covers the sides of both poly layers and the sides of the inter-poly dielectric layer.

Yet another aspect of the present invention provides a method for fabricating an electronic circuit, the circuit having a substrate, a gate oxide on the substrate, a floating-gate poly layer on the gate oxide, an inter-poly nitride layer on the floating gate poly layer, a control-gate poly layer on the inter-poly nitride layer; a tungsten-silicide (WSix) layer on the control-gate poly layer, and a nitride cap layer on the WSix layer. This method includes etching a plurality of isolation trenches along a first direction through the stack into the substrate, depositing a nitride spacer layer on sides of the isolation trenches, further etching to remove the nitride cap and to further deepen the plurality of isolation trenches into the substrate, filling the isolation trenches with tetraethylorthosilicate (TEOS), covering an area of the circuit with planarized borophosphosilicate glass (BPSG), etching lines along a second direction substantially perpendicular to the isolation trenches, depositing a nitride spacer layer on sides of the lines. The method also includes covering the area of the circuit with a thin TEOS layer, covering the area of the circuit with planarized (BPSG), etching trenches through the TEOS layer between adjacent transistors to the substrate and on portions of adjacent transistor areas to the WSix layer, using an etch that does not substantially etch nitride, depositing a titanium and/or titanium nitride (ti-nitride) barrier layer, filling the trench with tungsten, chemical-mechanical polishing (CMP) to planarize and remove tungsten and upper portions of oxide, stopping near tops of the nitride spacers, covering with BPSG, etching contacts through contact areas, depositing ti-nitride barrier layer in the contact areas, depositing tungsten in the contact areas, and chemical-mechanical polishing (CMP) back the tungsten to leave only the tungsten in the contact areas, and depositing aluminum copper (ALCU), etching interconnects, and covering with a passivation layer.

Yet another aspect of the present invention provides a method for fabricating an electronic circuit on a wafer. This method includes depositing a dielectric layer on a substrate of the wafer, depositing a first poly gate layer over the dielectric layer, depositing an inter-poly dielectric layer over the first poly layer, depositing a second poly gate layer over the inter-poly nitride layer, and removing the inter-poly dielectric and the second poly gate layer from some but not all of the first poly gate layer. One such embodiment also includes depositing a gate-signal-connection layer that forms electrical contacts to the first poly gate layer in an area in which the inter-poly dielectric and the second poly gate layers were removed, and to the second poly gate layer in an area in which the inter-poly dielectric and the second poly gate layers were not removed. In another such embodiment, a tungsten-silicide (WSix) layer is deposited over the second poly gate layer to reduce resistance.

The present invention thus provides a circuit for an EEPROM cell having a reduced-area footprint, and methods for fabricating such a circuit. The present invention also provides for fabricating a two-thickness gate oxide layer.

The present invention also provides for fabricating a polysilicon layer that is used for a floating gate poly for some transistors (which also include another poly gate for control), and is used for a regular gate for other transistors.

In some embodiments, an information-handling system (such as, for example, a personal computer or a cellular telephone) includes a processor, a display unit, an input/output subsystem, and a data storage memory, all coupled together. The memory includes an electronic data storage circuit according to embodiments of the present invention, for example, as described above.

DESCRIPTION OF PREFERRED EMBODIMENTS

Figure 1A:
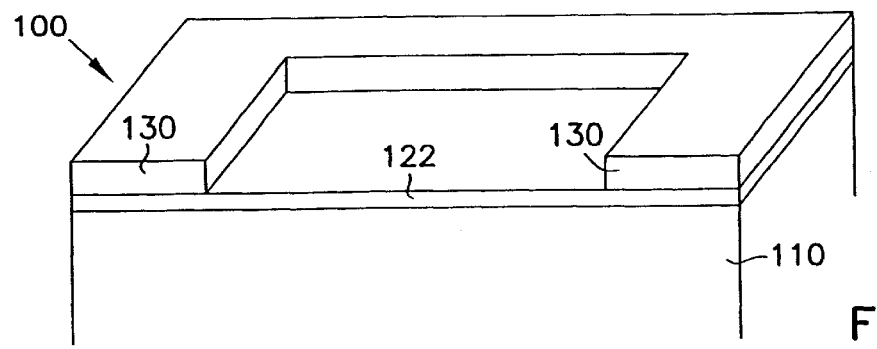
FIGS. 1A, 1B and 1C show an isometric cross section of chip 100 for one embodiment of the present invention, showing fabrication of two thicknesses of gate oxide.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

In FLASH memory circuits according to the present invention, a floating-gate field-effect transistor is provided for each memory cell. Electrical charge can be selectively moved onto the floating gate and will remain for an indefinite period of time. A floating gate having a stored charge represents is one logic state, e.g., the binary digit 1, while a non-charged floating gate represents the opposite logic state e.g., the binary digit 0. Charges are injected or written to a floating gate by any number of methods, including avalanche injection, channel injection, Fowler-Nordheim tunneling, and channel hot-electron injection, for example. The floating gate is discharged or erased by any number of methods including Fowler-Nordheim tunneling, for example.

Traditional field-effect transistors are used for logic and driving circuits along the periphery of the chip. A "chip" refers to an electronic integrated circuit, which, when complete and as used in an end-product, includes a housing package having interconnection leads. During fabrication, perhaps hundreds or thousands of such integrated circuits are simultaneously formed on a wafer. Once wafer processing is complete, the wafer is diced into individual circuit dies or chips, and are connected to a set of leads and packaged (for example, in a molded plastic encapsulant).

In one embodiment, the gate oxide for the floating-gate transistors in an EEPROM or FLASH circuit is thinner (in order to optimize that gate oxide thickness for tunneling and storage functions) than the gate oxide for transistors in the peripheral circuitry of the chip, (in order to optimize that gate oxide thickness for logic and driving functions).

Other embodiments of the present invention provide for integrated circuit chips having a plurality of gate oxide thicknesses on the same chip, and for a method for fabricating such chips. For example, one embodiment provides one or more transistors having a first gate oxide thickness, and one or more transistors having a second gate thickness. In one such embodiment, three or more gate oxide thicknesses are provided (e.g., one for transistors that interface to external signals, a second for transistors that interface to internal signals, and a third for transistors of a memory array).

Yet other embodiments of the present invention provide for integrated circuit chips having a plurality of thicknesses of other deposited layers on the same chip, and for a method for fabricating such chips. For example, one embodiment provides a polysilicon layer having a thickness for one portion of the chip, and having a second thickness for another portion of the chip.

In one embodiment, N and P regions are formed in silicon substrate 110, and then the gate oxide layer(s) are grown. In other embodiments, self-aligned gates are formed by diffusing source and drain regions using formed gate structures (described below) as masks.

Figure 1B:
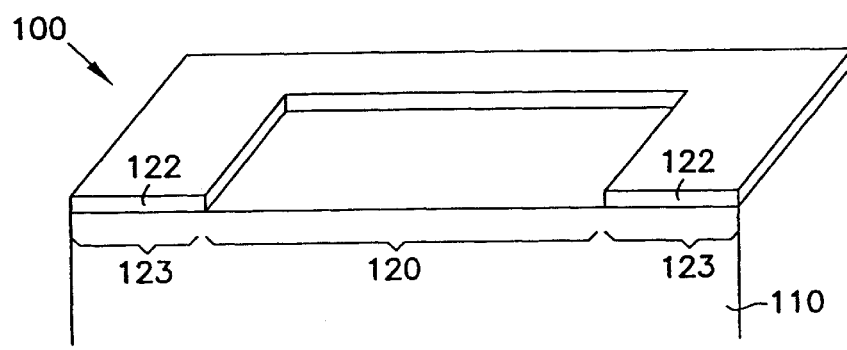
Figure 1C:
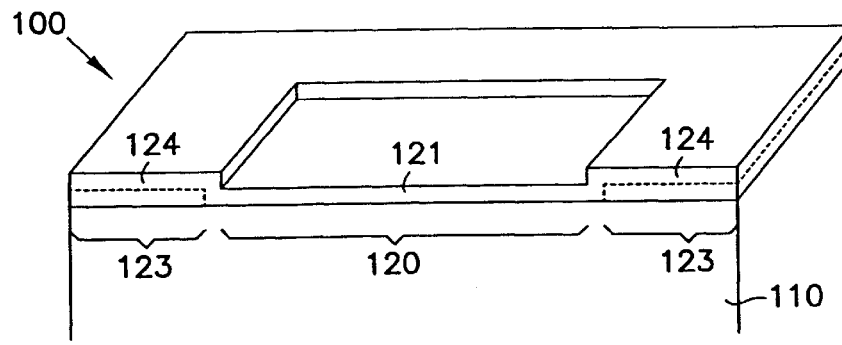

FIGS. 1A, 1B and 1C show a cross section of chip 100 for one embodiment of the present invention, showing fabrication of two thicknesses of gate oxide. In one embodiment, the central area 120 of chip 100 is used for the memory cell array and has a thin gate oxide, and the peripheral area 123 of chip 100 is used for logic and driving transistors, and has a thicker gate oxide. In this embodiment, an initial oxide layer 122 (i.e., silicon dioxide) is grown on silicon substrate 110 (e.g., on the entire upper surface, which is the portion of interest). A mask layer 130 (e.g., of photoresist) is deposited on top of oxide layer 122 and is "patterned" (e.g., using photolithography, the deposited photoresist layer 130 is exposed to a suitable wavelength of light through a mask, then the unexposed photoresist is chemically dissolved leaving a pattern of photoresist which protects certain areas during subsequent etching steps or other processing steps), as shown in FIG. 1A, where oxide layer 122 has been coated with a photolithographic photoresist mask 130 for patterning the first oxide layer in preparation for etching. The exposed area of oxide layer 122 is etched away (for example, etched by the process of hydrofluoric wet etching, or other suitable wet etch), and the photoresist is then removed (e.g., dissolved in a suitable solvent). An additional oxide layer is then grown over the entire surface of interest, thus generating a thin gate oxide layer 121 over the entire central area 120 of chip 100 used for the memory cell array, and generating a thicker gate oxide layer 124 (i.e., the initial oxide thickness 122, plus additional oxide that is grown in these areas during the growth of oxide layer 121) over the entire peripheral area 123 of chip 100 used for the logic and driving circuitry. The present invention is not limited to chips having a thin gate oxide in the central portion and a thick gate oxide in the peripheral portion 123 of the chip. For example, in one other such embodiment, logic transistors are provided in various portions of the central area of chip 100, and thus those portions of oxide layer 122 are also masked by first mask layer 130 in order to provide the thicker gate oxide in those portions. In one embodiment, three or more different gate oxide thicknesses are provided on various portions of a surface, such as shown in FIG. 1D.

Figure 1D:
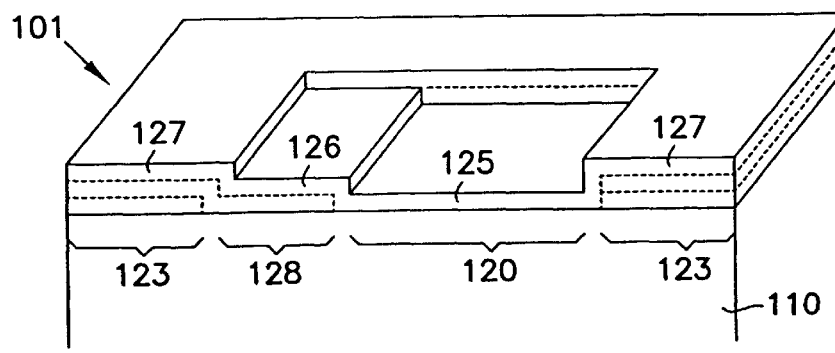
FIG. 1D shows an isometric cross section of chip 101 for another embodiment of the present invention, showing fabrication of three thicknesses of gate oxide.
Figure 1E:
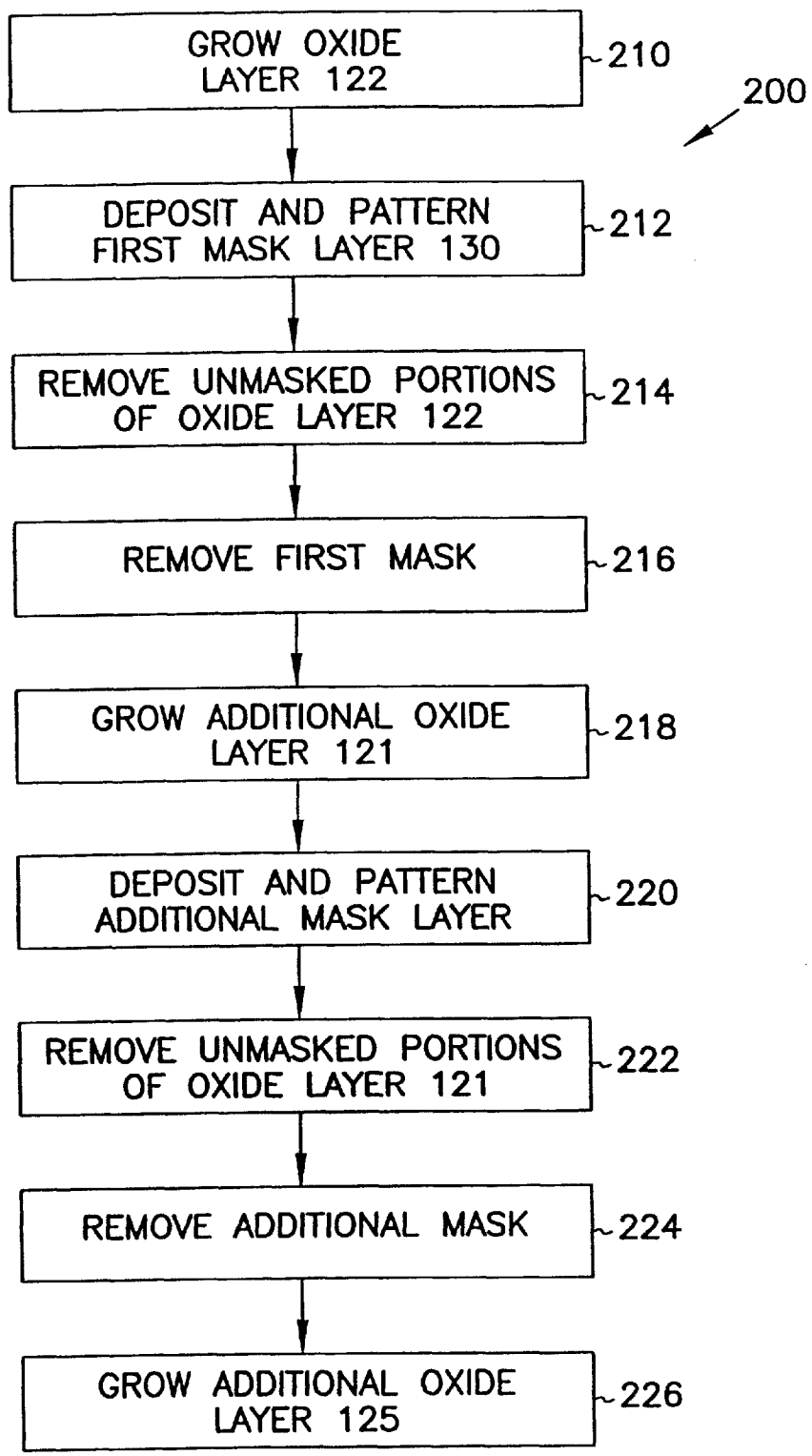
FIG. 1E shows a process 200 for fabricating the plurality of different oxide thicknesses as shown for chips 100 and 101 of FIGS. 1C and 1D, respectively.

FIG. 1E shows a process 200 for fabricating the plurality of different oxide thicknesses as shown for chips 100 and 101 of FIGS. 1C and 1D, respectively. At step 210, a first oxide thickness 122 is grown over the entire chip. At step 212, a mask layer is deposited and those portions which are to have gate oxide thickness 122 or 127 are masked. At step 214 the unmasked portions of oxide layer 122 are removed (e.g., etched away), as described above. At step 216 the first mask is removed, and at step 218 a second oxide thickness 121 is grown over the entire chip. For chip 100 as shown in FIG. 1C (i.e., two gate oxide thicknesses), this completes the oxide fabrication process 200.

For chip 101 as shown in FIG. 1D, steps 220, 222, 224 and 226 are also performed. At step 220, a second (or additional) mask layer is deposited and those portions which are to have gate oxide thickness 126 and those portions which are to have gate oxide thickness 127 are masked. At step 222 the unmasked portions of oxide layer 121 are removed (e.g., etched away), as described above. At step 224 the additional mask is removed, and at step 226 a third oxide thickness 125 (or additional oxide thickness) is grown over the entire chip. In embodiments requiring more different oxide thicknesses, steps 220–226 are repeated, masking the appropriate areas as needed.

In other embodiments, the present invention provides a circuit having at least one FET whose gate has two or more thicknesses, for example, where it is desired to vary the gate-thickness profile of an FET in order to customize the characteristics of the FET. The method of FIG. 1E is then used to pattern such a gate-thickness profile.

Thus, in one embodiment, an electrically erasable programmable read-only memory (EEPROM) integrated circuit chip 100 is provided having one or more floating-gate memory-cell transistors having a first gate oxide thickness 121, and one or more transistors having a second gate thickness 124.

Further, in other embodiments, an electrically erasable programmable read-only memory (EEPROM) circuit (again, having one or more floating-gate memory-cell transistors having a first gate oxide thickness 121, and one or more transistors having a second gate thickness 124) is included as a portion of an integrated circuit chip 100, wherein chip 100 also includes other functions, such as, for example, a microprocessor or computer-on-a-chip, programmable controller, input/output, memory cache, or other functions.

Figure 2A:
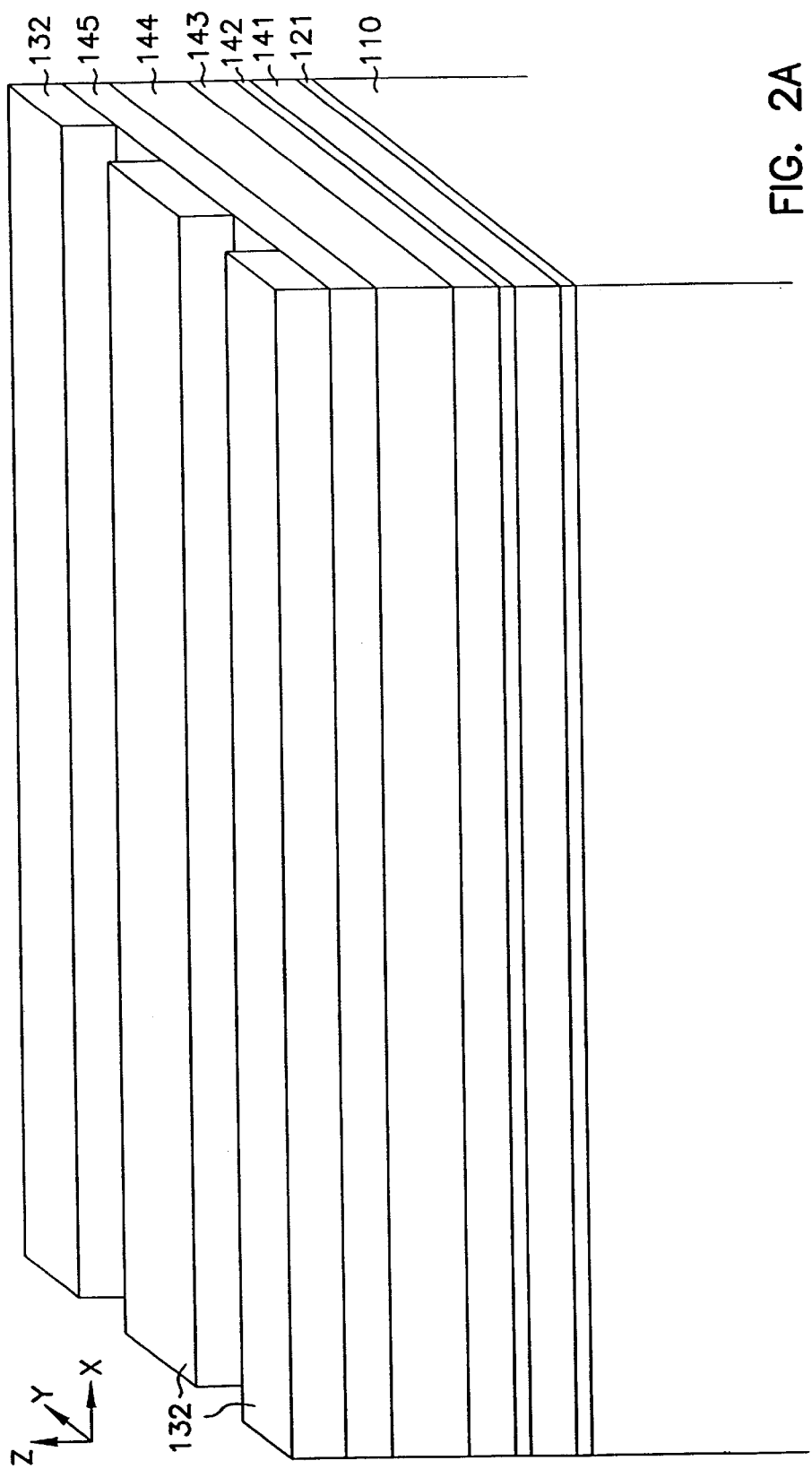
FIG. 2A is an isometric cross-section view of chip 100 showing initial deposited layers.

FIG. 2A is an isometric cross-section view showing initial deposited layers for the memory-cell area 120. The successive layers deposited on silicon substrate 110 are floating-gate-oxide layer ("gate ox") 121, floating-gate-polycrystaline-silicon layer ("floating-gate poly") 141, interpoly layer 142 (in one embodiment, interpoly layer 142 is a gate oxide followed by a silicon-nitride layer; in another embodiment, it is a silicon-nitride layer), control-gate-polycrystaline-silicon layer ("control-gate poly") 143, tungsten-silicide (WSix) layer 144, and silicon nitride cap layer ("nitride cap") 145. A mask layer 132 (e.g., of photoresist) is then deposited and patterned as shown. Isolation trenches 151, extending in the X direction as defined by mask layer 132, are then etched through all of the deposited layers and partially into silicon substrate 110. A silicon nitride spacer deposition 152 is then deposited, in particular coating the X-direction side walls of trenches 151.

Figure 2B:
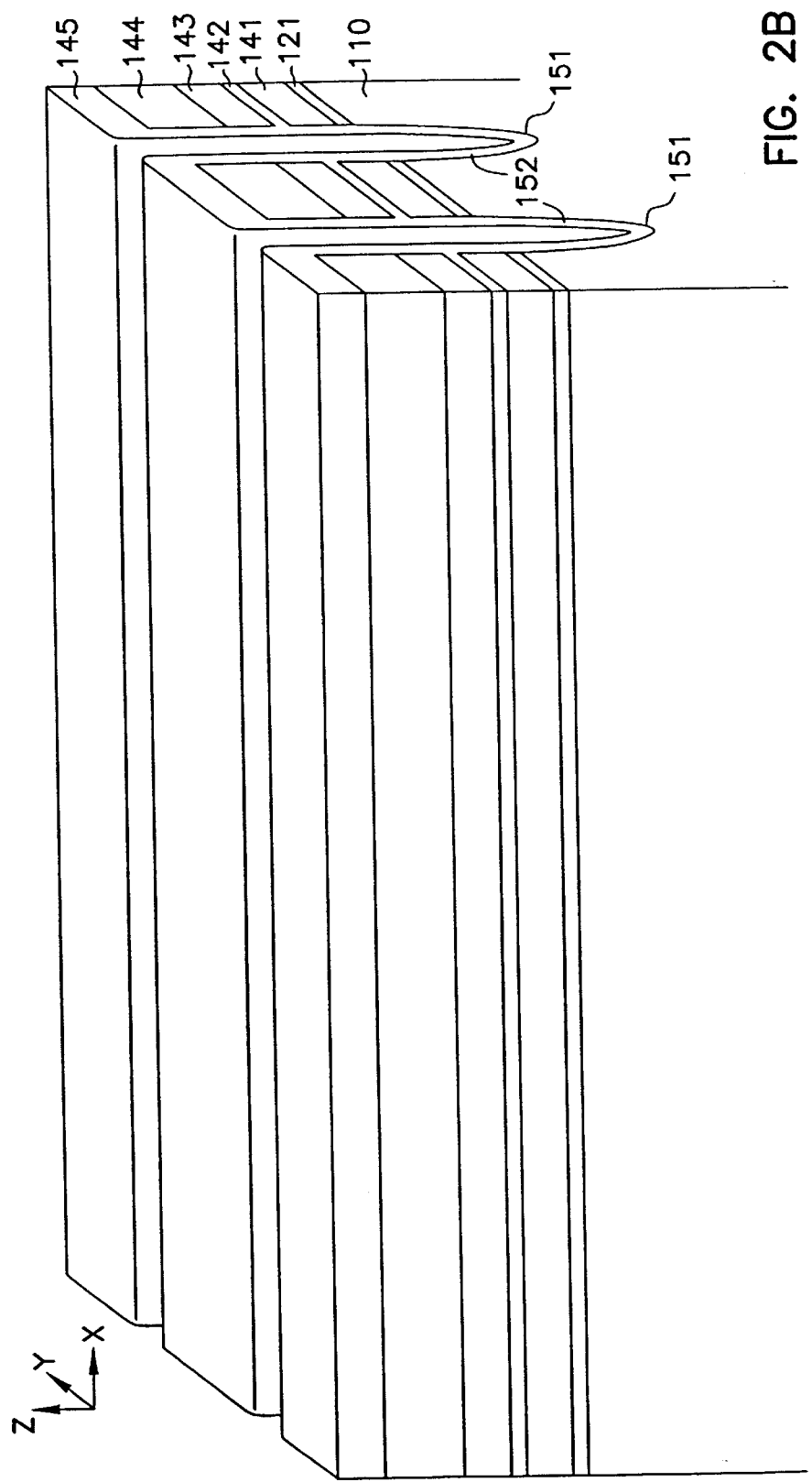
FIG. 2B is an isometric cross-section view of chip 100 showing patterned and etched isolation trenches 151, with a nitride spacer deposition 152.

FIG. 2B is an isometric cross-section view showing patterned and etched isolation trenches 151, with a nitride spacer deposition 152. An etching step then removes the nitride cap 145, with an over-etch to the point that the nitride cap 145 is removed and that the trench into silicon substrate 110 is deepened.

Figure 2C:
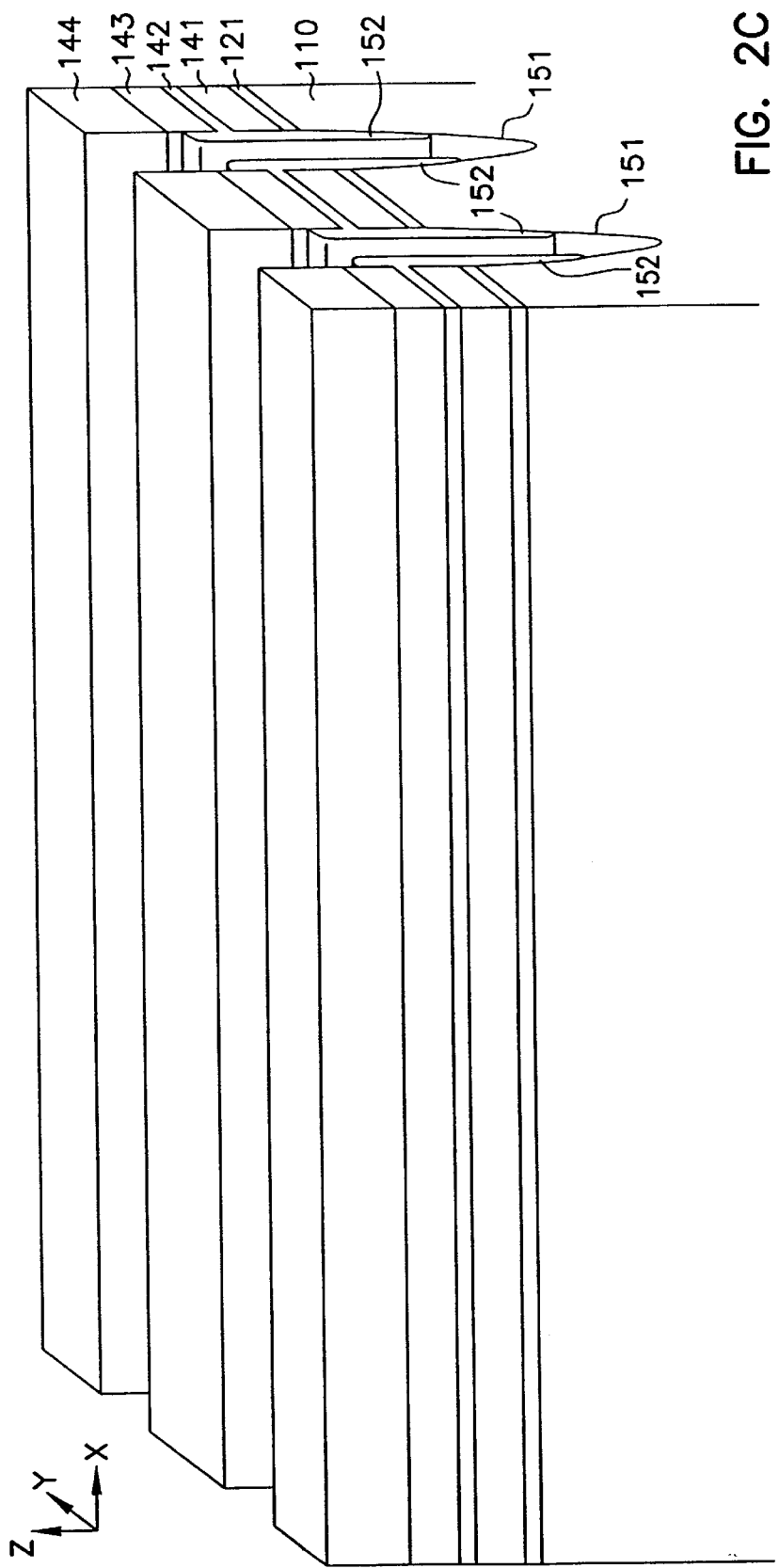
FIG. 2C is an isometric cross-section view showing chip 100 after the nitride cap 145 is etched away and the trenches 151 are deepened.

FIG. 2C is an isometric cross-section view showing chip 100 after the nitride cap 145 is etched away and the isolation trenches 151 are deepened. A layer of TEOS (tetraethylorthosilicate) oxide 161 (an insulator) is then deposited (for example, by chemical vapor deposition (CVD)) to fill trenches 151, and the TEOS oxide layer 161 is covered by a BPSG (boron-phosphorous-silicate glass) layer 162 (another insulator).

Figure 2D:
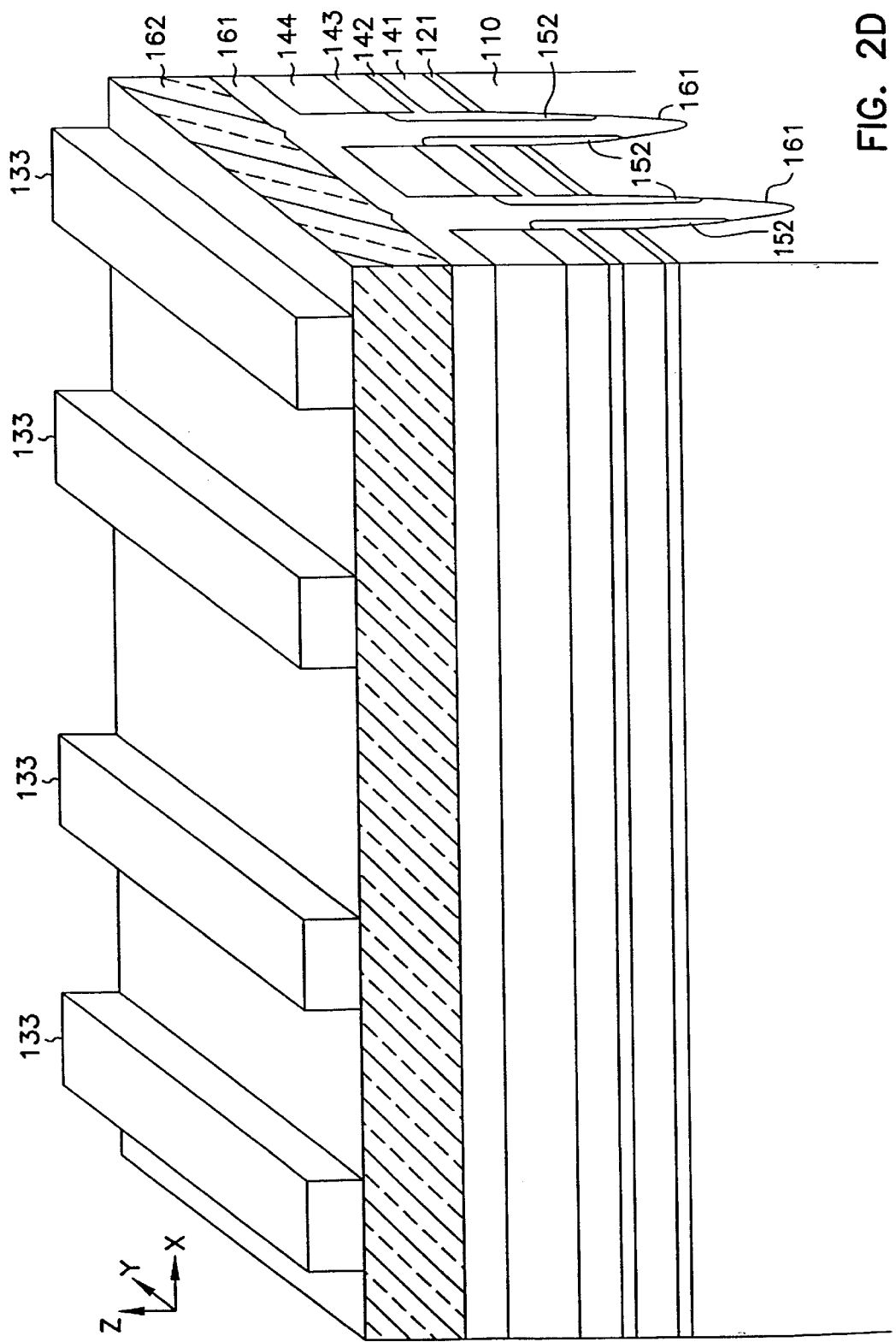
FIG. 2D is an isometric cross-section view showing chip 100 after filling with TEOS oxide 161 and covering with planarized BPSG 162.

FIG. 2D is an isometric cross-section view showing chip 100 after filling isolation trenches 151 with TEOS oxide 161 and covering with a layer of planarized BPSG 162. A mask layer 133 (e.g., of photoresist) is then deposited and patterned as shown. "Trenches" 164 (which separate rows 165), extending in the Y direction as defined by mask layer 133, are then etched substantially vertically through all of the deposited layers down to silicon substrate 110.

Figure 3A:
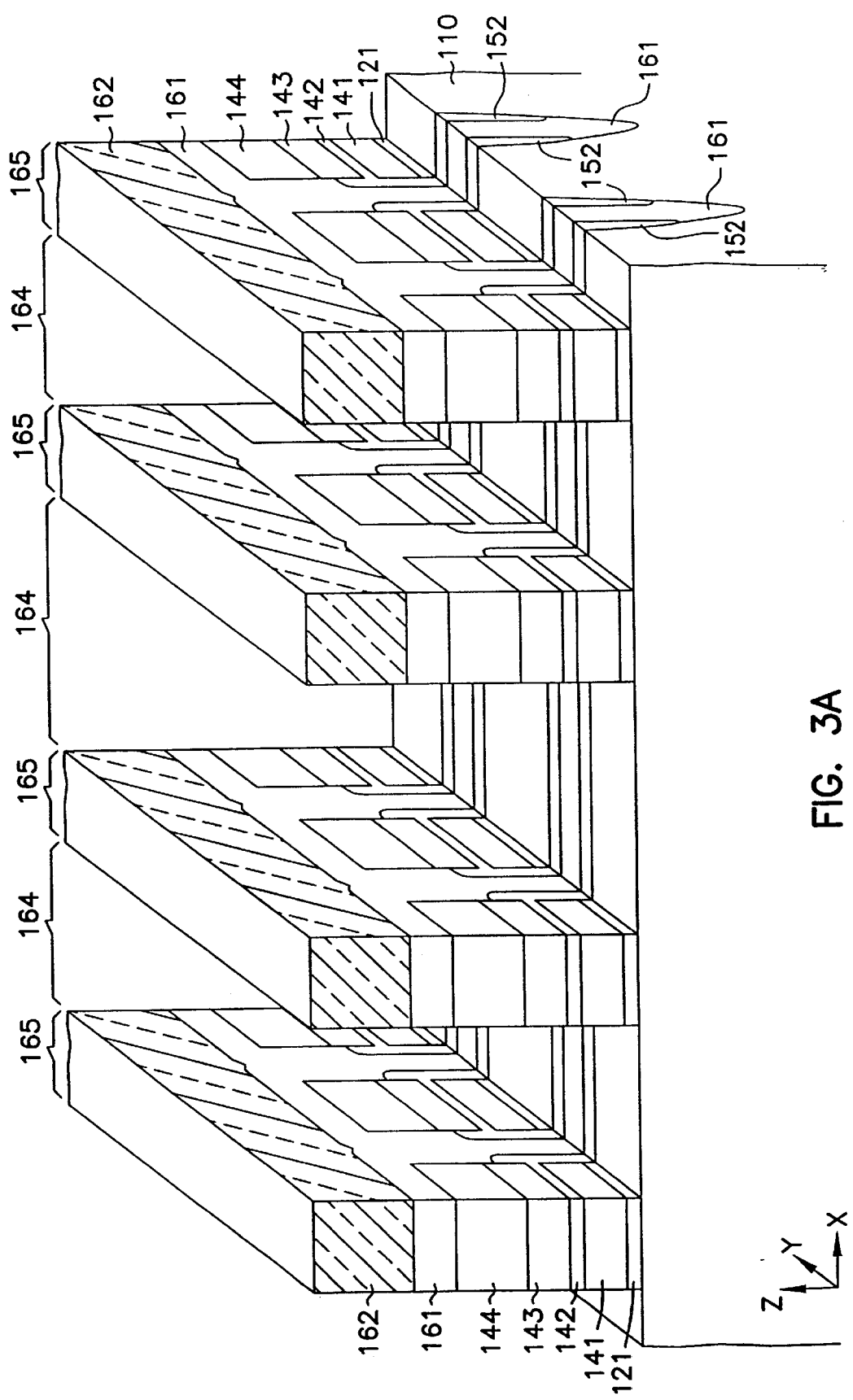
FIG. 3A is an isometric cross-section view showing chip 100 after patterning and etching lines perpendicular to the isolation trenches 151.

FIG. 3A is an isometric cross-section view showing chip 100 after patterning and etching lines perpendicular to the isolation trenches 151. A spacer layer of silicon nitride 172 is then deposited, in particular coating the Y-direction side walls of trenches 164. The cap of nitride layer 172 on the top of rows 165 and the nitride layer 172 on the floors of trenches 164 are then removed by etching, leaving just the nitride layer 172 on the side walls of rows 165 as shown in FIG. 3B.

Figure 3B:
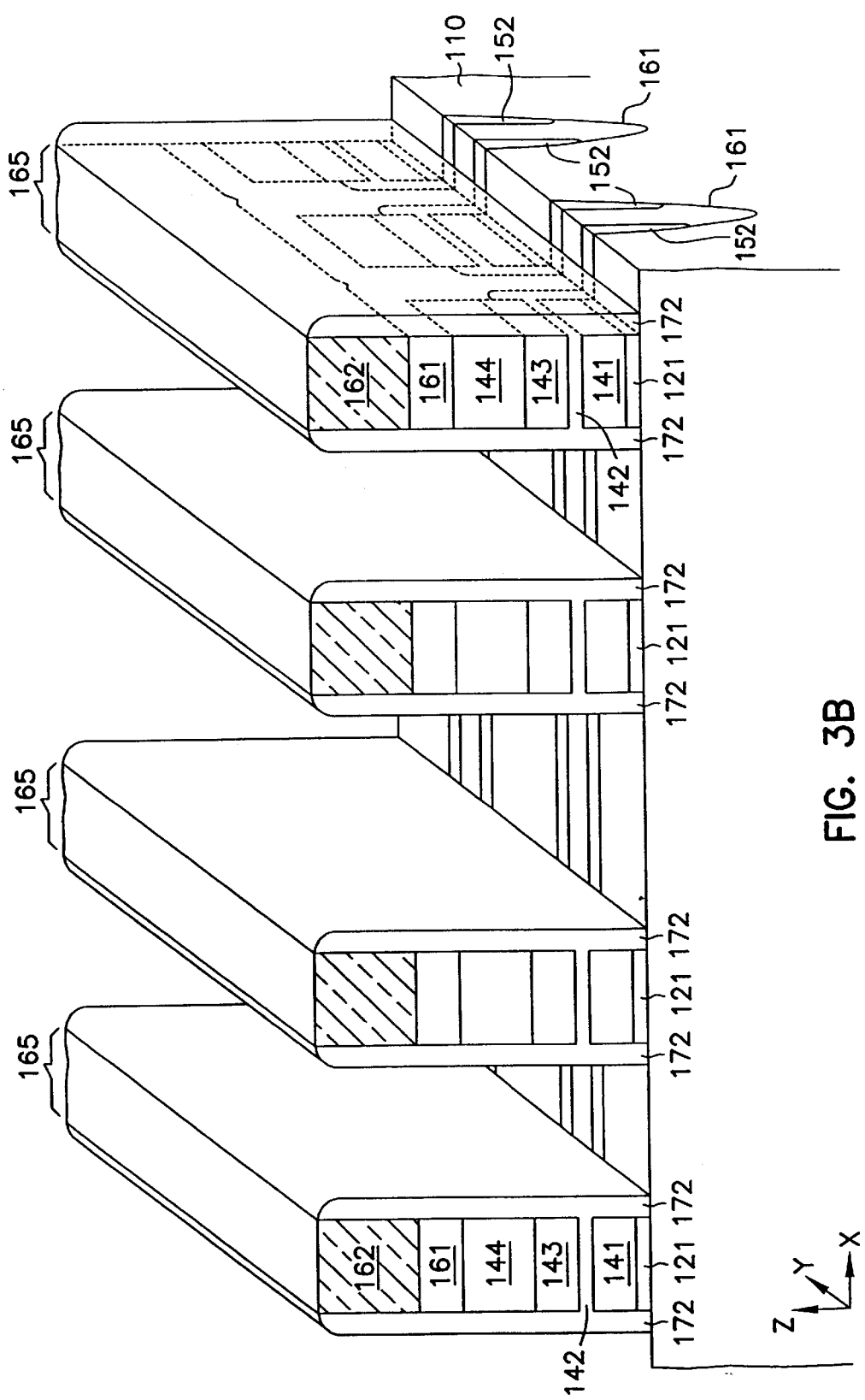
FIG. 3B is an isometric cross-section view showing chip 100 after depositing and etching nitride side spacers 172.

FIG. 3B is an isometric cross-section view showing chip 100 after depositing and etching nitride side spacers 172. A thin layer of TEOS oxide 173 is deposited, and a layer of BPSG 174 is deposited and planarized.

Figure 4:
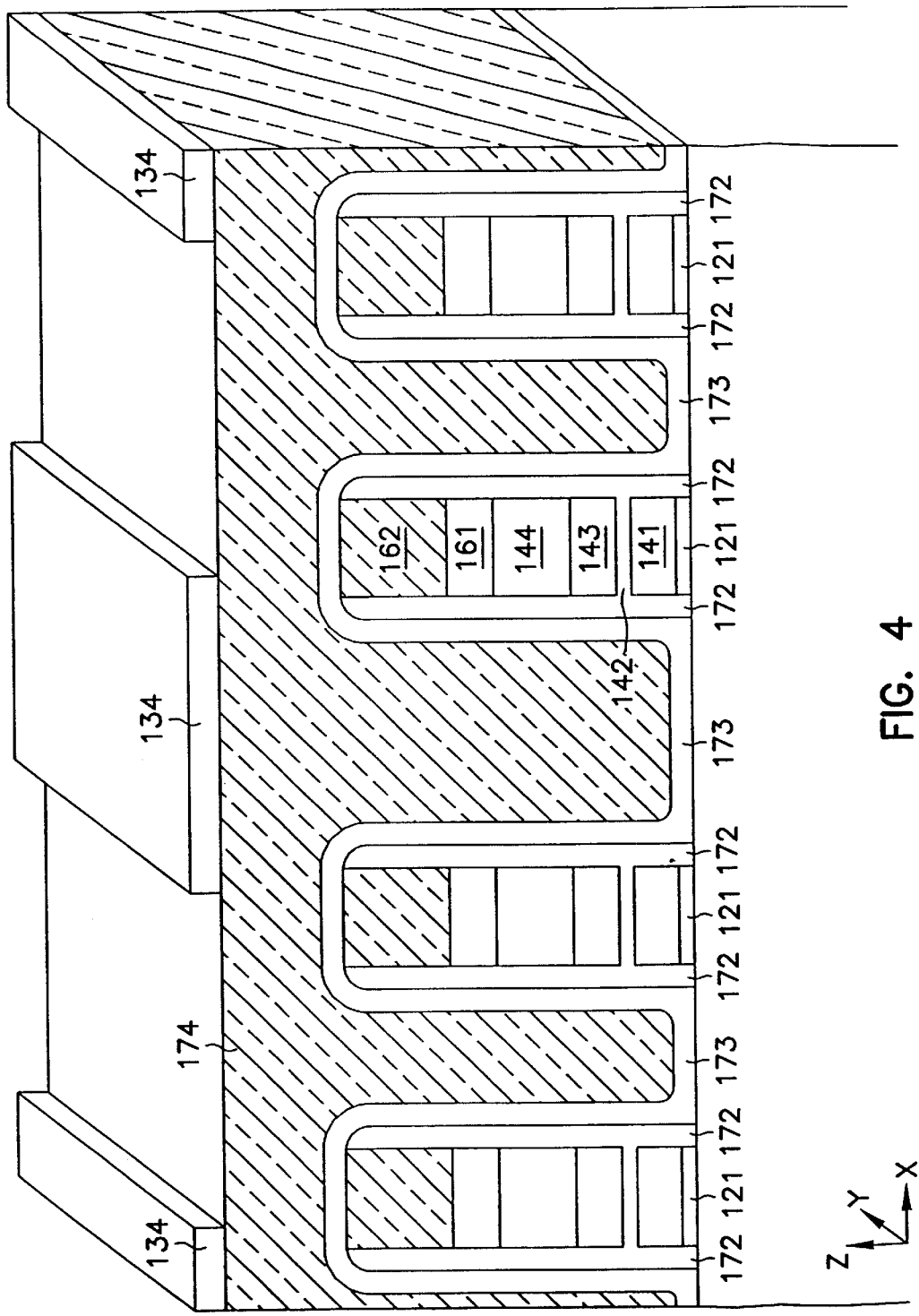
FIG. 4 is an isometric cross-section view showing chip 100 after covering with a TEOS oxide layer 173 and a planarized layer of BPSG.

FIG. 4 is an isometric cross-section view showing chip 100 after covering with a TEOS oxide layer 173 and a planarized layer of BPSG 174. A mask layer 134 is then deposited and patterned as shown in FIG. 4, defining stripes in the Y direction in the memory array area. Y-direction trenches are then selectively etched down to (but not into or through) the WSix layer 144 on the floating-gate stack, down to (but not into or through) the source contact 112 on the substrate 110, and into but not through the TEOS filling the trenches between the nitride spacers 152. One reason for the depth of trenches 151 and for the depth of the coating of nitride spacers 152 down the walls of the floating-gate stack well into the trench 151 in the substrate, with the subsequent filling of the trench with TEOS 161, is to prevent this etch step from going all the way to the substrate 110. The sides of the trench at the bottom of this etch will remain completely covered with nitride layer 152, electrically isolating the substrate at the walls, and the bottom of trench 151 will remain filled with TEOS 161, electrically isolating the substrate at the bottom.

Figure 5A:
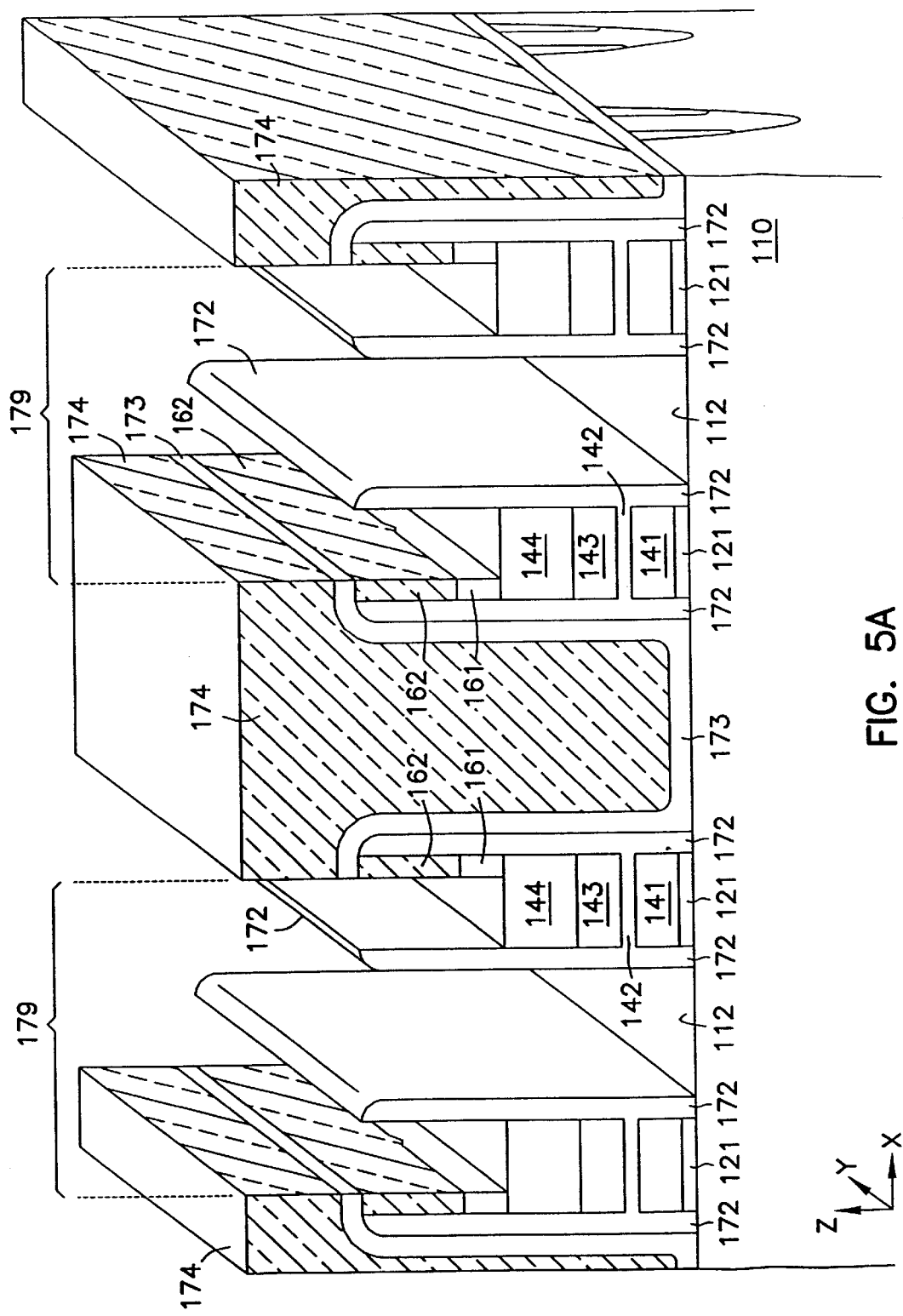
FIG. 5A is an isometric cross-section view showing chip 100 after patterning and etching trenches 179 with an etch that will not etch nitride.
Figure 5B:
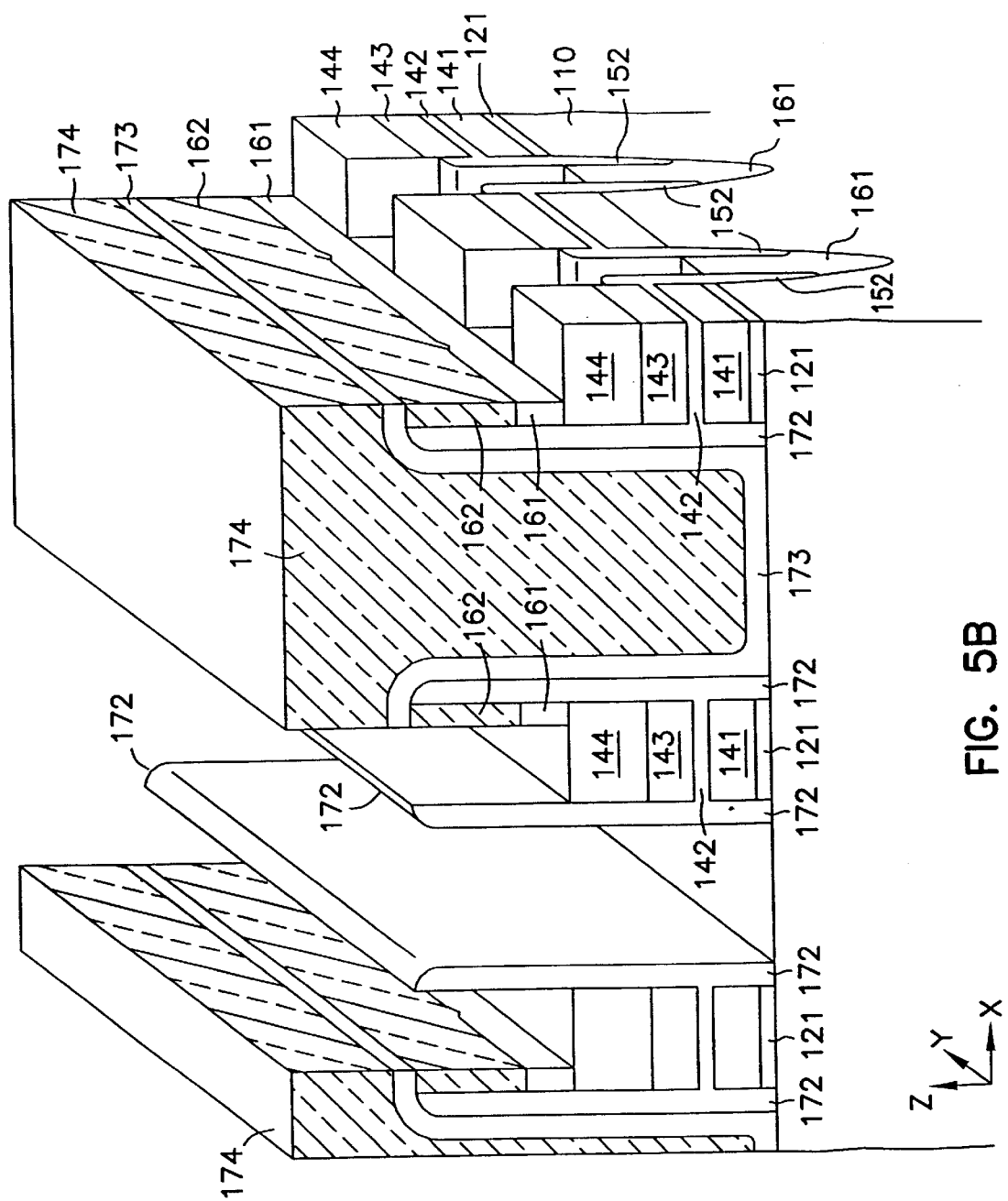
FIG. 5B is an isometric cross-section view of chip 100 at the same point in processing as FIG. 5A, but with a Y-direction cross-section though the floating gate stack.

FIG. 5A is an isometric cross-section view showing chip 100 after patterning and etching trenches 179 with an etch that will not etch nitride. FIG. 5B is an isometric cross-section view of chip 100 at the same point in processing as FIG. 5A, but with a Y-direction cross-section through the floating gate stack. In one embodiment, a titanium layer is at the silicon interface, so a layer of tisilicide forms at the silicon/titanium interface when annealed. This helps to reduce resistance at this interface. A barrier layer 180 (for example, either a thin layer of titanium or of titanium-titanium-nitride ("ti—ti-nitride", i.e., a thin layer of titanium followed by a thin layer of titanium-nitride) is deposited, and the trenches are filled with tungsten. Barrier layer 180 is used to prevent migration of the tungsten or "wormholes" between the tungsten and the silicon substrate 110 or the poly gates. Note that, in one embodiment, the WSix layer 144 forms a low-resistance interface between the tungsten word lines 183 and the control gates 143 of the floating-gate stacks of the memory-cell transistors. In other embodiments, the memory device chip 100 is built without WSix layer 144.

Figure 6A:
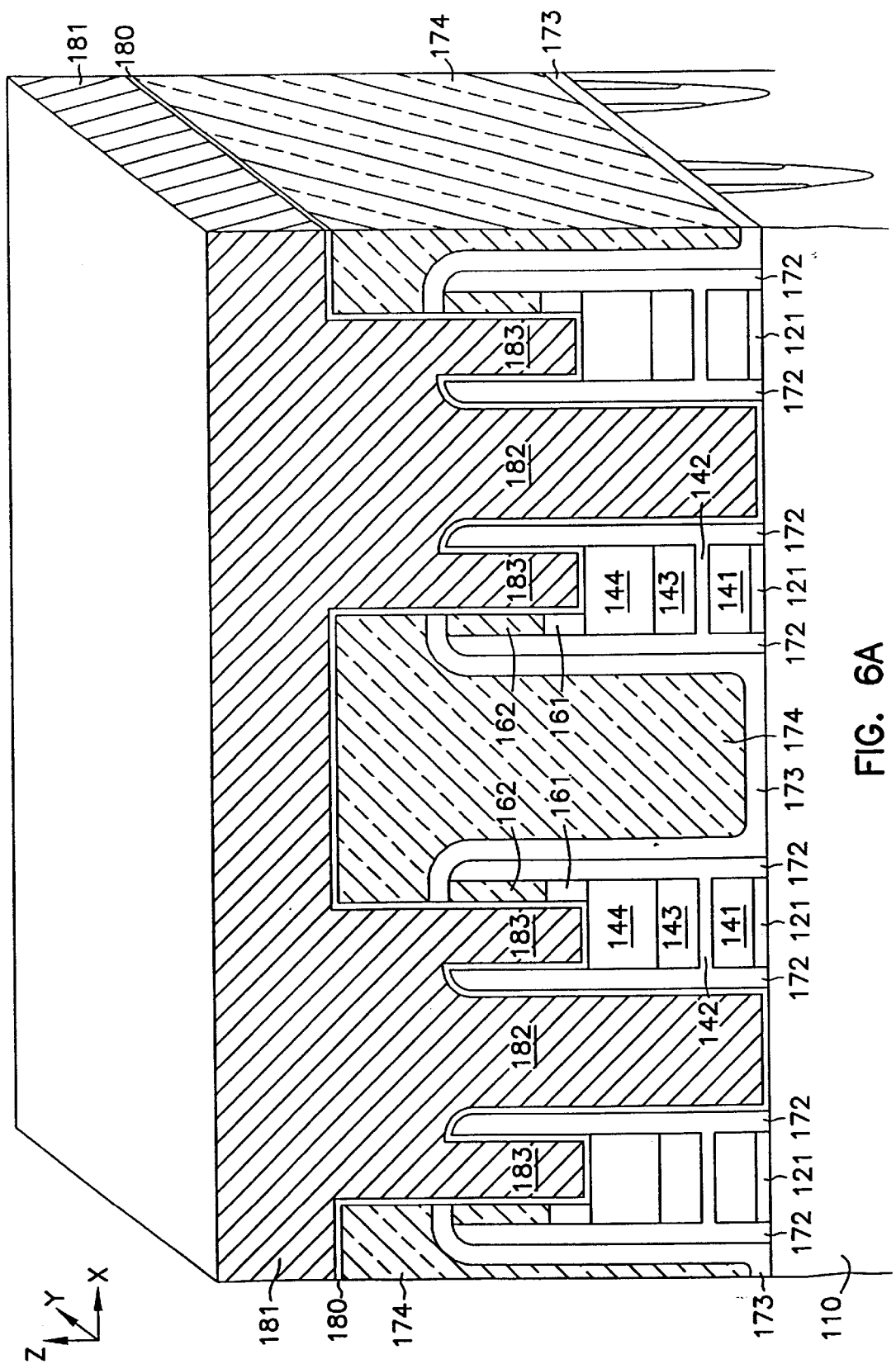
FIG. 6A is an isometric cross-section view of chip 100 after depositing a barrier layer 180 and filling trench 179 with tungsten 181.
Figure 6B:
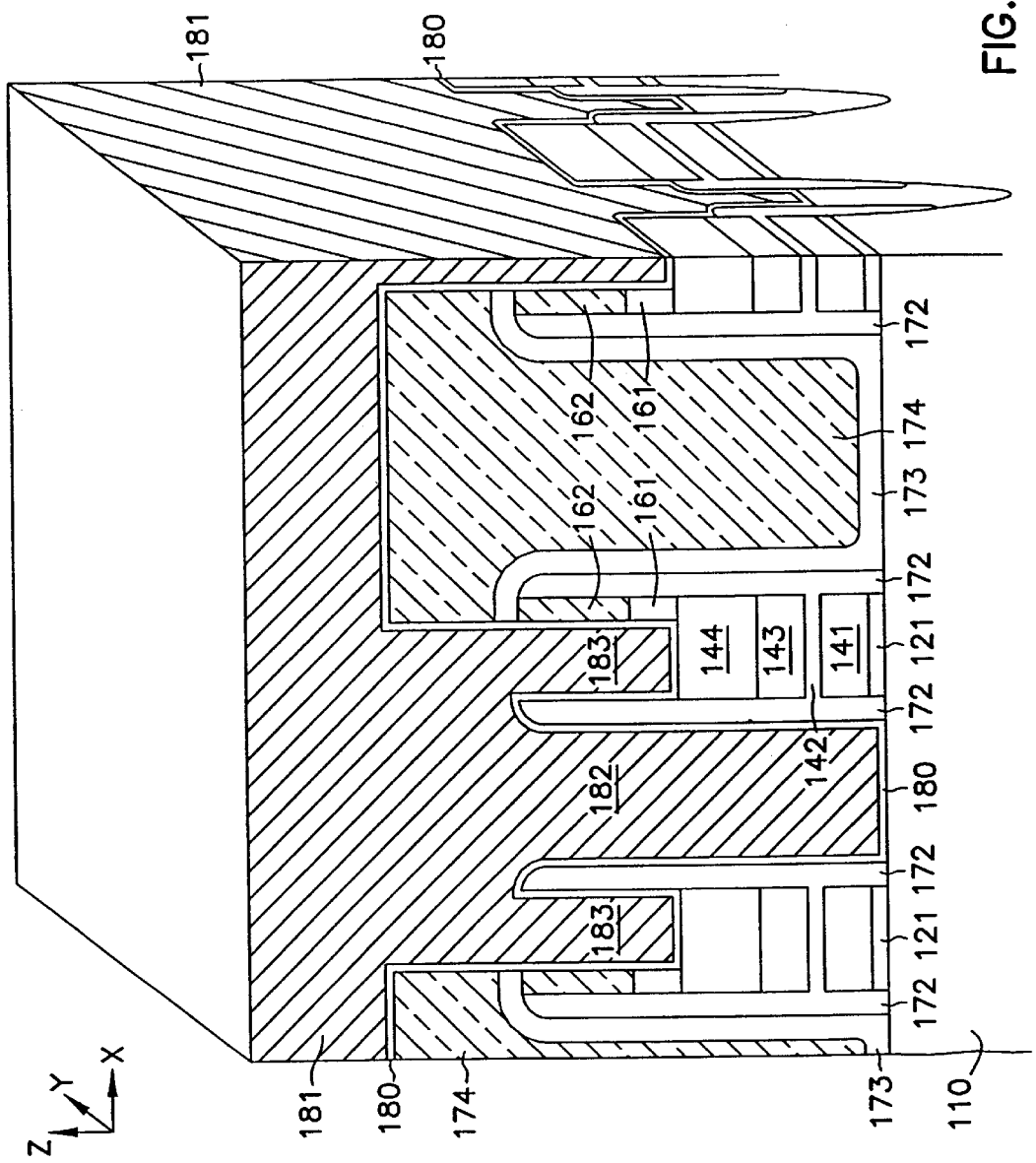
FIG. 6B is an isometric cross-section view of chip 100 at the same point in processing as FIG. 6A, but with a Y-direction cross-section though the floating gate stack.

FIG. 6A is an isometric cross-section view showing chip 100 after depositing a barrier layer 180 and filling trench 179 with tungsten 181. FIG. 6B is an isometric cross-section view of chip 100 at the same point in processing as FIG. 6A, but with a Y-direction cross-section though the floating gate stack. The top surface is then removed down to the tops of the nitride spacers 172, for example by chemical-mechanical polishing (CMP) to a planar surface. By removing this much, the nitride spacers 172 form insulating spacers separating tungsten word lines 183 which contact the control gates 143–144 from the tungsten lines 182 that contact the sources 112.

Figure 7:
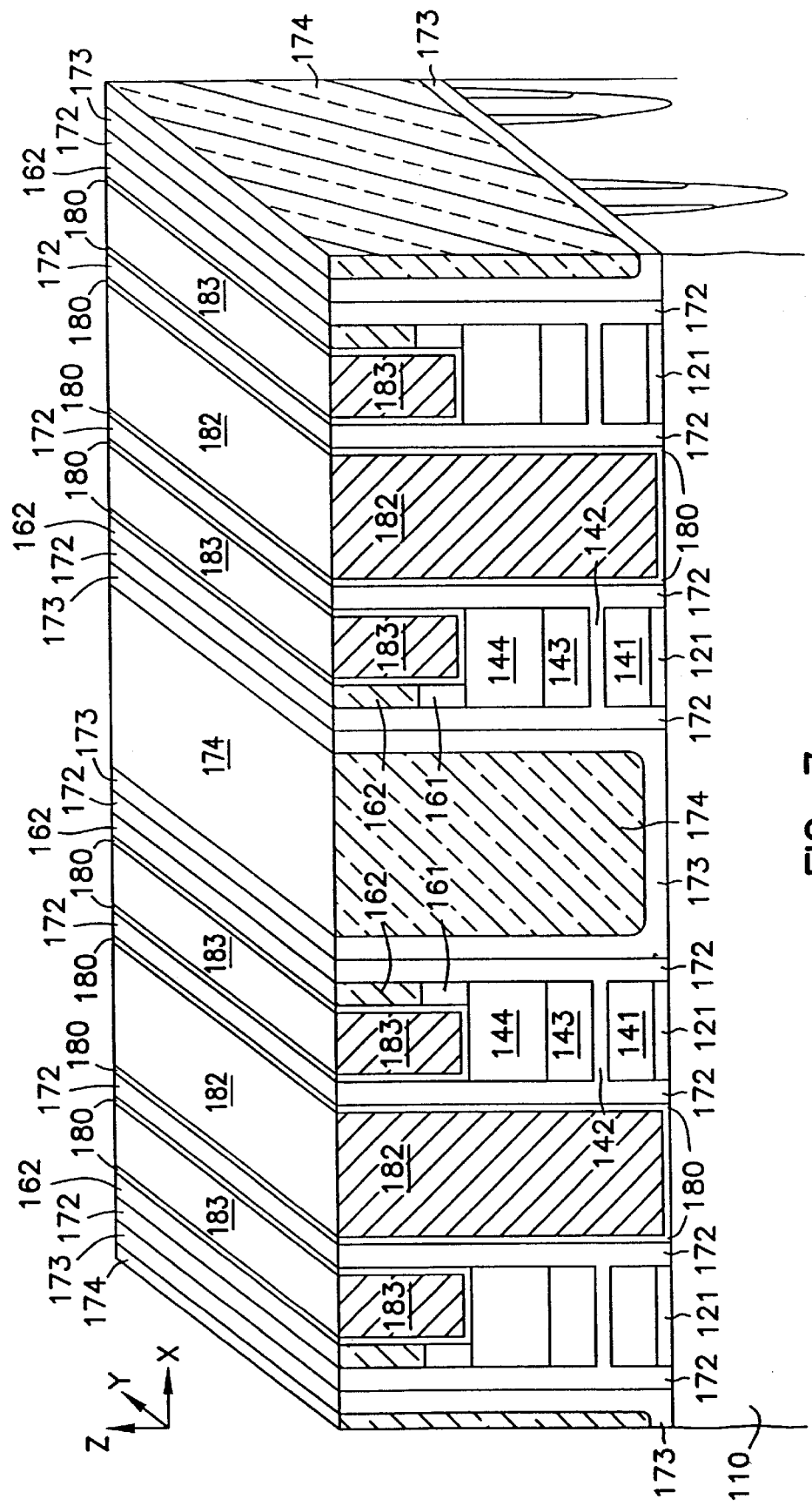
FIG. 7 is an isometric cross-section view showing chip 100 after chemical-mechanical polishing (CMP) to a planar surface.

FIG. 7 is an isometric cross-section view showing chip 100 after chemical-mechanical polishing (CMP) to a planar surface. The CMP step stops at or near the tops of the nitride spacers 172. The wafer is then covered with BPSG insulator layer 184 and a mask layer for the next etch step. Drain contact openings 189 are etched (as masked) through the BPSG layer 184 and BPSG 174 down to the drain contacts 114 on substrate 110. Drain contact openings 189 will be filled with tungsten to form posts 191.

Figure 8A:
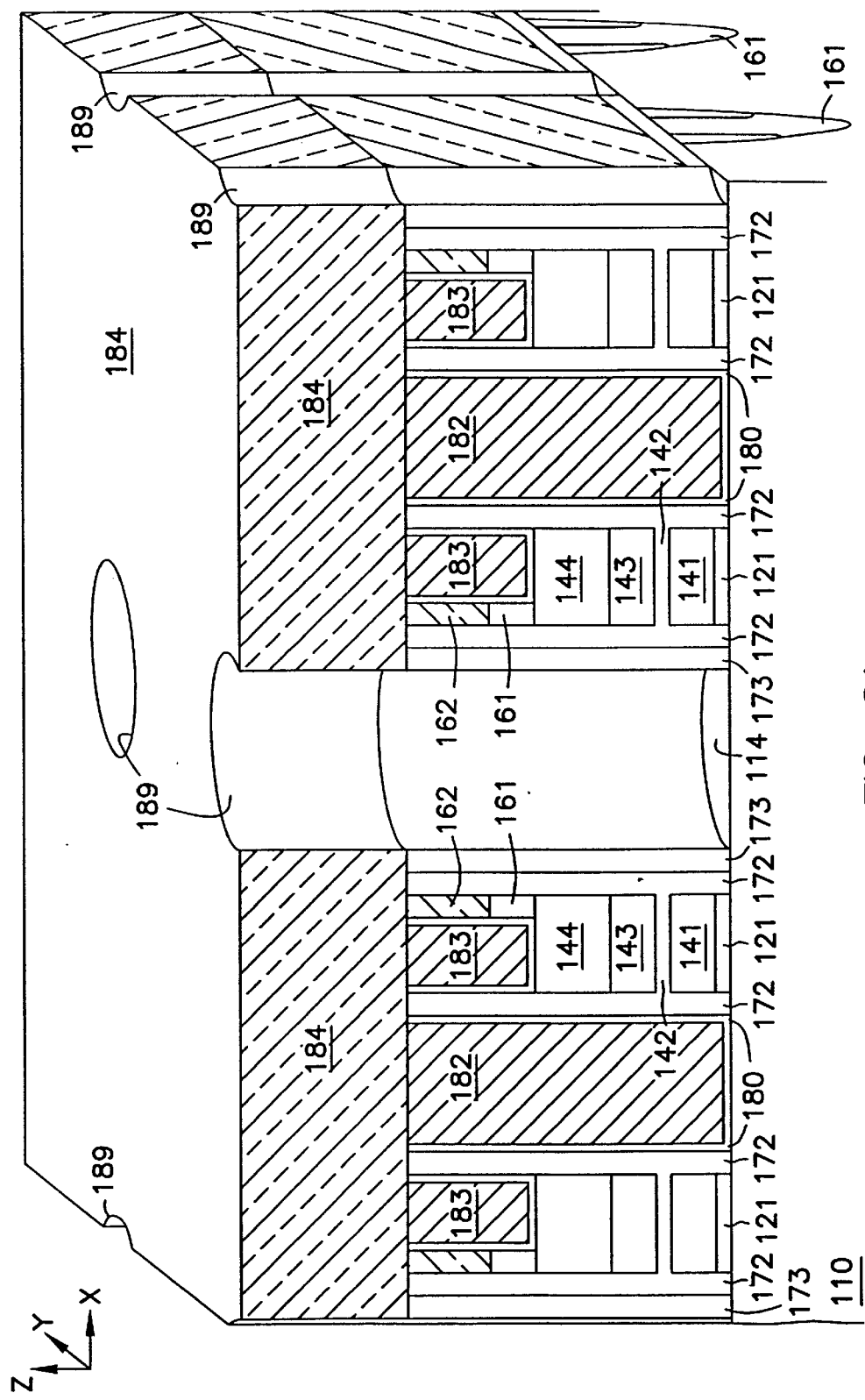
FIG. 8A is an isometric cross-section view showing chip 100 after covering with BPSG 184 and etching contact openings 189.

FIG. 8A is an isometric cross-section view showing chip 100 after covering with BPSG 184 and etching contact openings 189. A barrier layer 190 (for example, either a thin layer of titanium or of ti—ti-nitride) is deposited, and the trenches are filled with tungsten 191. Barrier layer 190 performs the same function as barrier layer 180 described above. The top of tungsten 191 and the top of BPSG 184 are then removed, leaving a planar surface and tungsten posts 191.

Figure 8B:
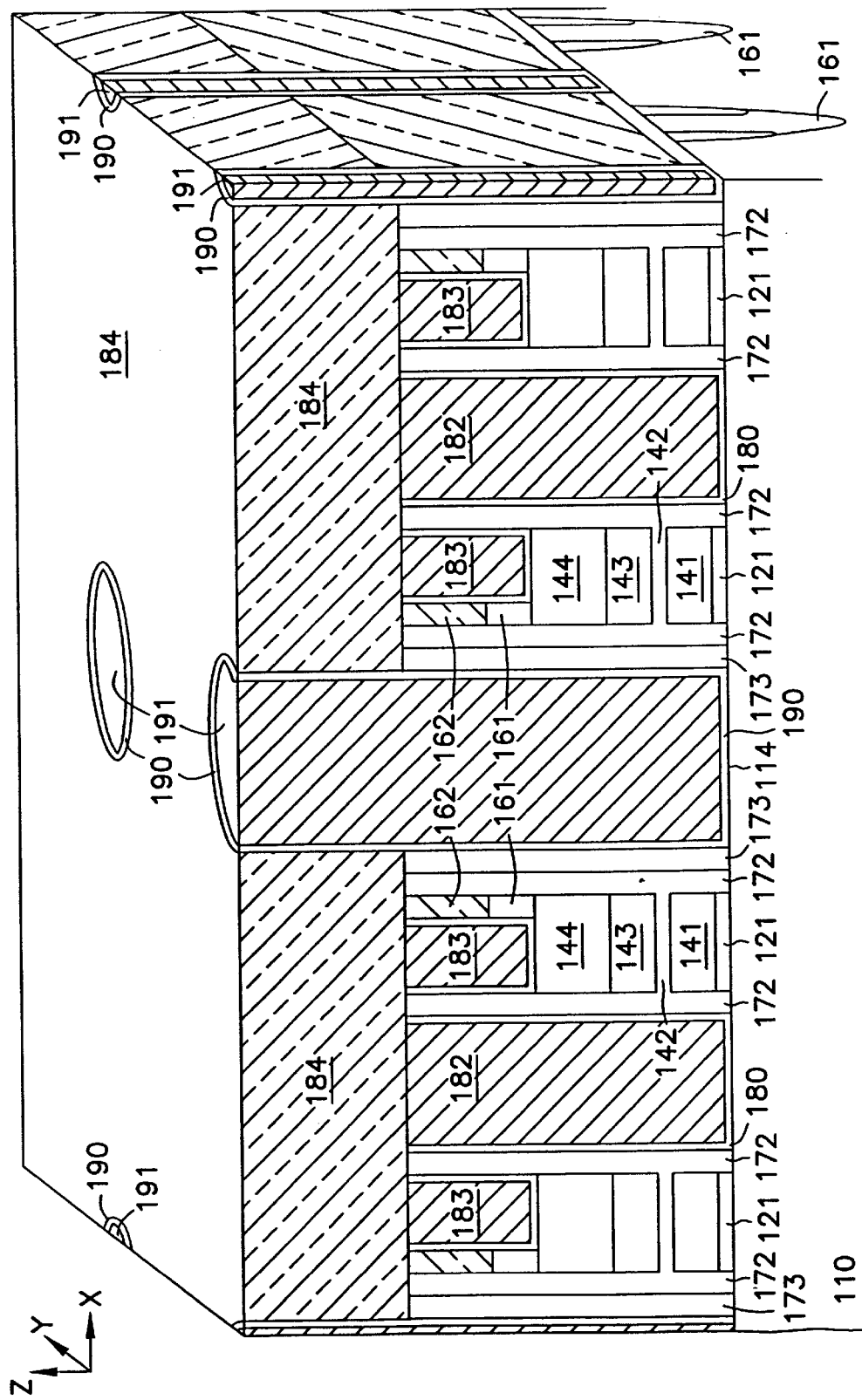
FIG. 8B is an isometric cross-section view showing chip 100 after depositing a barrier layer 190 and filling the contact openings 189 with tungsten 191, and CMP back to a planar surface.

FIG. 8B is an isometric cross-section view showing chip 100 after depositing a barrier layer 190 and filling the contact openings 189 with tungsten 191, and CMP back to a planar surface. A metal layer 192 of, for example, a titanium 192.1—aluminum copper alloy (AlCu) 192.2—tinitride 192.3 (titanium nitride) sandwich (or "metal stack") is then deposited.

Figure 9A:
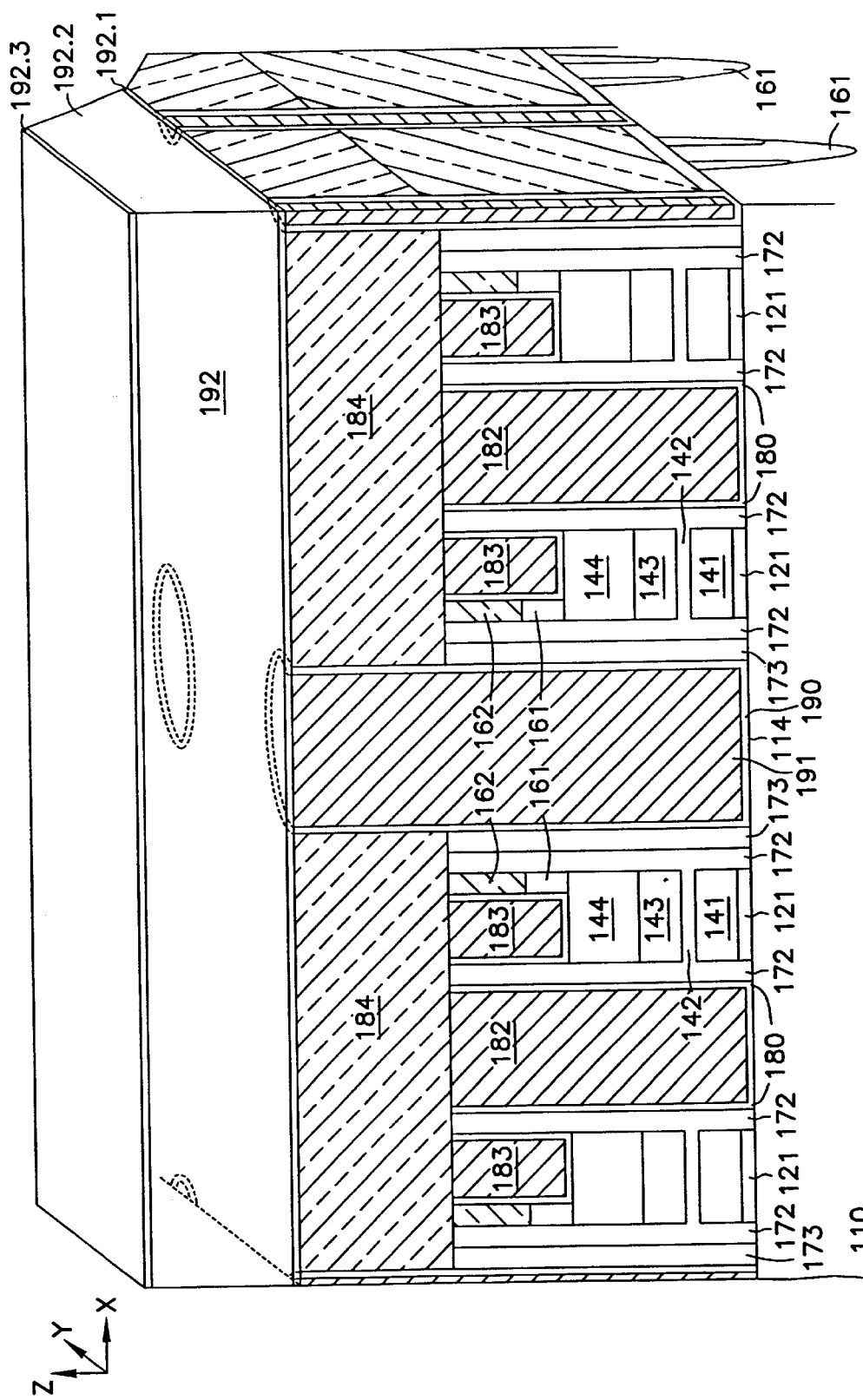
FIG. 9A is an isometric cross-section view showing chip 100 after depositing a titanium-AlCu-tinitride layer 192.

FIG. 9A is an isometric cross-section view showing chip 100 after depositing a metal stack 192. A mask layer is then deposited and patterned, and metal stack 192 is etched into bit lines 193.

Figure 9B:
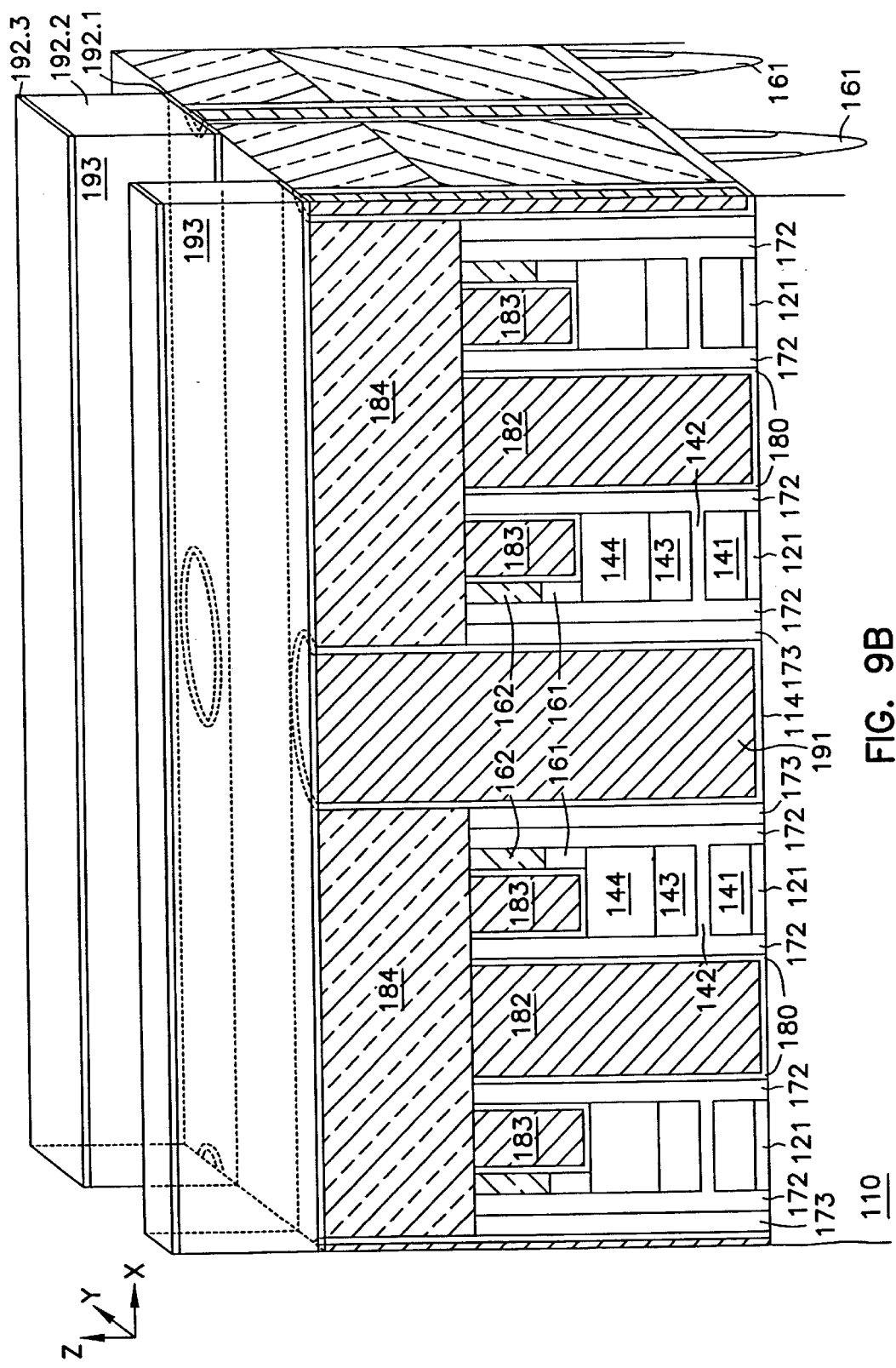
FIG. 9B is an isometric cross-section view showing chip 100 after etching the Ti—AlCu-tinitride stack layer 192 to form bit lines 193 connected to tungsten posts 191.
Figure 9C:
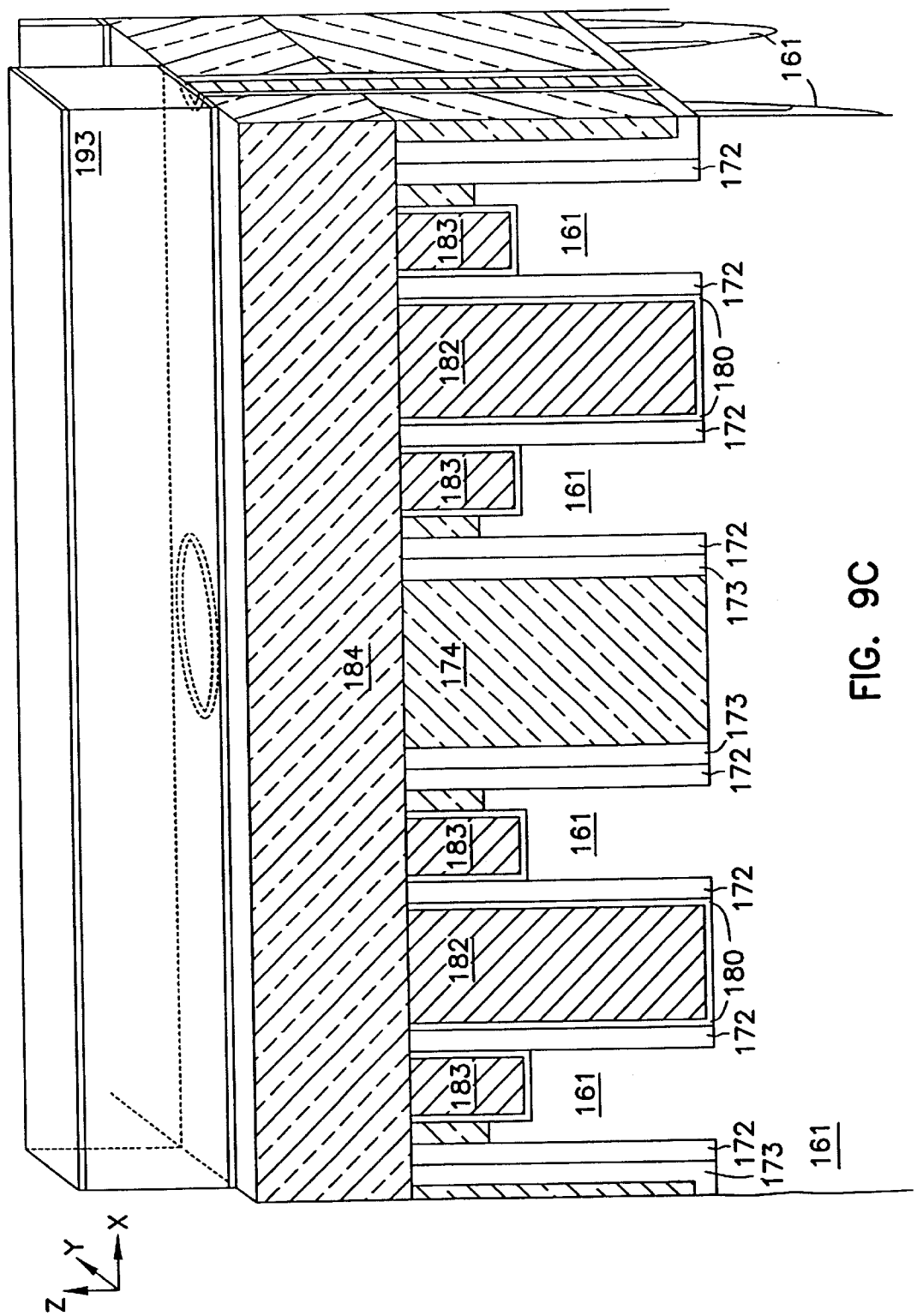
FIG. 9C is another isometric cross-section view showing chip 100 as in FIG. 9B, but with the front surface at a different Y-plane than FIG. 9B.

FIG. 9B is an isometric cross-section view showing chip 100 after etching the metal stack 192 to form bit lines 193 connected to tungsten posts 191. FIG. 9C is another isometric cross-section view showing chip 100 as in FIG. 9B, but with the front surface at a different Y-plane than FIG. 9B. The wafer is then covered with a passivation layer 198.

Figure 9D:
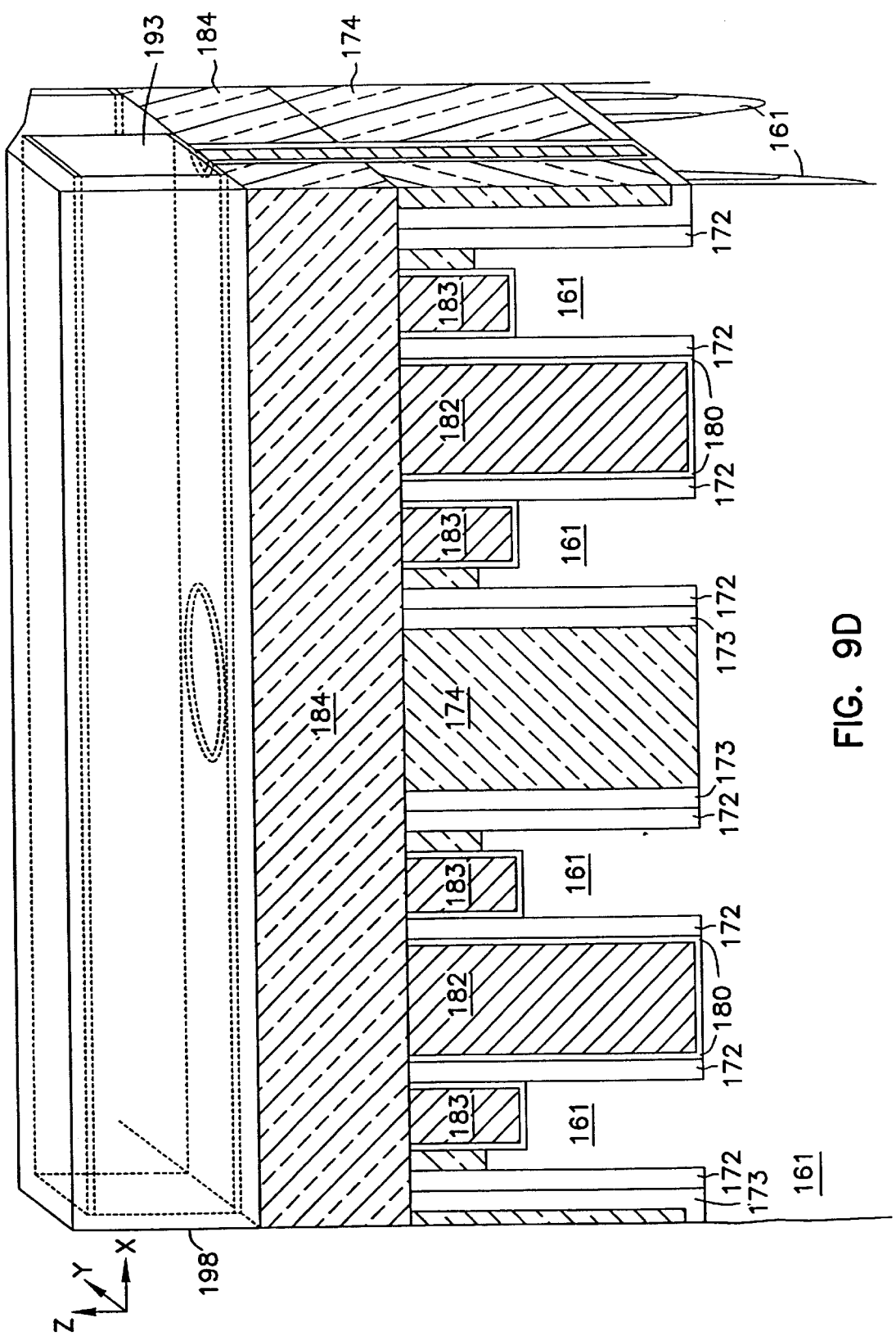
FIG. 9D is an isometric cross-section view showing chip 100 after covering with passivation layer 198.

FIG. 9D is an isometric cross-section view showing chip 100 after covering with passivation layer 198.

SUMMARY

After the N and P regions have been formed, an initial gate oxide layer 122 is grown on the silicon wafer 100. The initial gate oxide layer is of such a thickness that when its thickness is increased during the growth of the "floating gate" gate oxide (or "tunnel oxide") 121, it will increase to the thickness that is needed for the gate oxide that will be used to form the N- and P-channel logic and driver transistors in the chip periphery 123. After initial oxide layer 122 is grown, a mask pattern is put down that masks off the periphery 123 where the logic and driver transistors will be formed. The oxide 122 is then removed from (etched off of) those portions of the silicon 110 where the memory arrays will be formed. In one embodiment, a wet etch is used. After a non-oxide-depleting clean sequence to remove the remaining mask, the floating-gate gate oxide 121 is grown in the array (and simultaneously, the oxide layer 122 in the periphery thickens to its final thickness 124). In the periphery, this step thickens up the previous oxide 122 to the thickness 124 that is needed for the access-transistor gate oxide. The floating-gate poly 141 is then deposited, followed by interpoly layer 142 (that, in one embodiment, includes a gate oxide layer, a nitride layer and a wet gate layer. This is one standard capacitor dielectric: O—N—O, or oxide-nitride-oxide process, for forming cell dielectrics in poly O—N—O capacitors for DRAMS.)

A mask pattern is then put down that masks off the arrays. The interpoly layer 142 is then etched off of the periphery where the transistors will be formed. A poly layer 143, then a tungsten-silicide (WSix) layer 144, followed by a nitride layer 145 is put down. In one embodiment, WSix layer 144 is omitted. A mask pattern 132 is then put down. Mask pattern 132 patterns trenches 151 in the memory that run in the X-direction that will be used to form isolation between the active areas. In the periphery 123, all of the field areas are exposed and will be etched out. When trench 151 is etched, it is etched down through all of the deposited and grown layers into the silicon substrate 110. A nitride spacer layer 152 is then deposited. This nitride spacer layer 152 is needed to prevent the later barrier/tungsten layer from shorting out to the floating gate 141 and/or silicon substrate 110 at the tops of the isolation areas. The nitride layer 145 and 152 is then spacer etched, leaving nitride spacers 152; it is over-etched so that the trench depth of trench 151 is now what is needed to form isolation and remove the nitride cap 145. The trench 151 and field areas are then filled with TEOS oxide 161, followed by BPSG 162. The depth of the trench 151 into the silicon 110 prior to the nitride spacer dep and etch will be determined by how far the oxide in the isolation regions is recessed just prior to the barrier/tungsten interconnect deposition.

The BPSG 162 is then planarized so that the open field areas in the periphery 123 are at the same height as the areas over the dense memory array 120. In one embodiment, this uses a CMP polish step. A mask pattern 133 is then put down that defines the transistors in the periphery 123 and the widths of the floating gate stacks in the memory array area 120. The floating gate stacks in the memory portion of chip 100 run perpendicular to the isolation trenches (see FIG. 3A).

An in-situ etch is then performed down to and stopping on the respective gate oxides (i.e., gate oxides 121 in the array area and 124 in the periphery). This in-situ etch has, first, a low selective step or steps that remove most of the series of layers above the floating gate poly. Once the layers above the floating gate poly are removed, a highly selective step removes the floating gate poly but does not etch through the gate oxides. In one embodiment, an isotropic poly etch is performed at the end of the etch to remove poly stringers from the field active area interface between the runners due to the raised field oxide that will be left by the high selective poly etch needed to stop on the gate oxide.

A nitride spacer 172 is then deposited and etched, forming a spacer on the vertical sidewall over the source and drain ends of the floating-gate stacks. In one embodiment, this is done in a number of steps and layers for the situation wherein the isolation on the sides of the runners in the array needs to be a different thickness than does the spacing for the implants for the transistors in the periphery 123.

A TEOS oxide layer 173 followed by a BPSG layer 174 is then deposited.

A mask pattern 134 is then put down. In the memory array 120, trenches 179 are exposed where the two tungsten runners 183 (in other embodiments, poly runners 183 are used instead of, or in addition to, the tungsten runners 183) that are side by side with the source runner 182 and the active area in between them are all exposed out as the same resist trench. The active areas where the drain contacts will go are covered with a band of resist.

In the periphery 123, underlying interconnects and transistor interconnects and access are exposed out. A high selective oxide etch that does not etch nitride is then performed. The oxide (162 and 161) is etched out down to the top of the WSix layer 144, or in embodiments wherein it is decided that WSix layer 144 is not necessary on top of the transistors and poly runners, then down to the poly 143 and silicon substrate 110. See FIG. 5A.

A titanium or ti—ti-nitride barrier layer 180 is then deposited. The trenches, interconnects, etc. are then deposited full of tungsten 181 (including the gate trenches 183 and the source trenches 182).

The wafer is then put through a CMP planar process where the tungsten 181 and oxide 174 is polished down to the tops of the nitride spacers 172. The nitride spacers 172 then isolate the tungsten 183 that forms the interconnects for the runners from the tungsten 182 that interconnects the active areas (the source contacts 112) between them in the memory. A BPSG layer 184 or other oxide is then deposited and contacts 189 patterned and etched into it to active areas (drain contacts 114) and other active and interconnect contact locations in the periphery.

Metal interconnects are deposited, then patterned and etched and covered by appropriate passivation layers.

Figure 10:
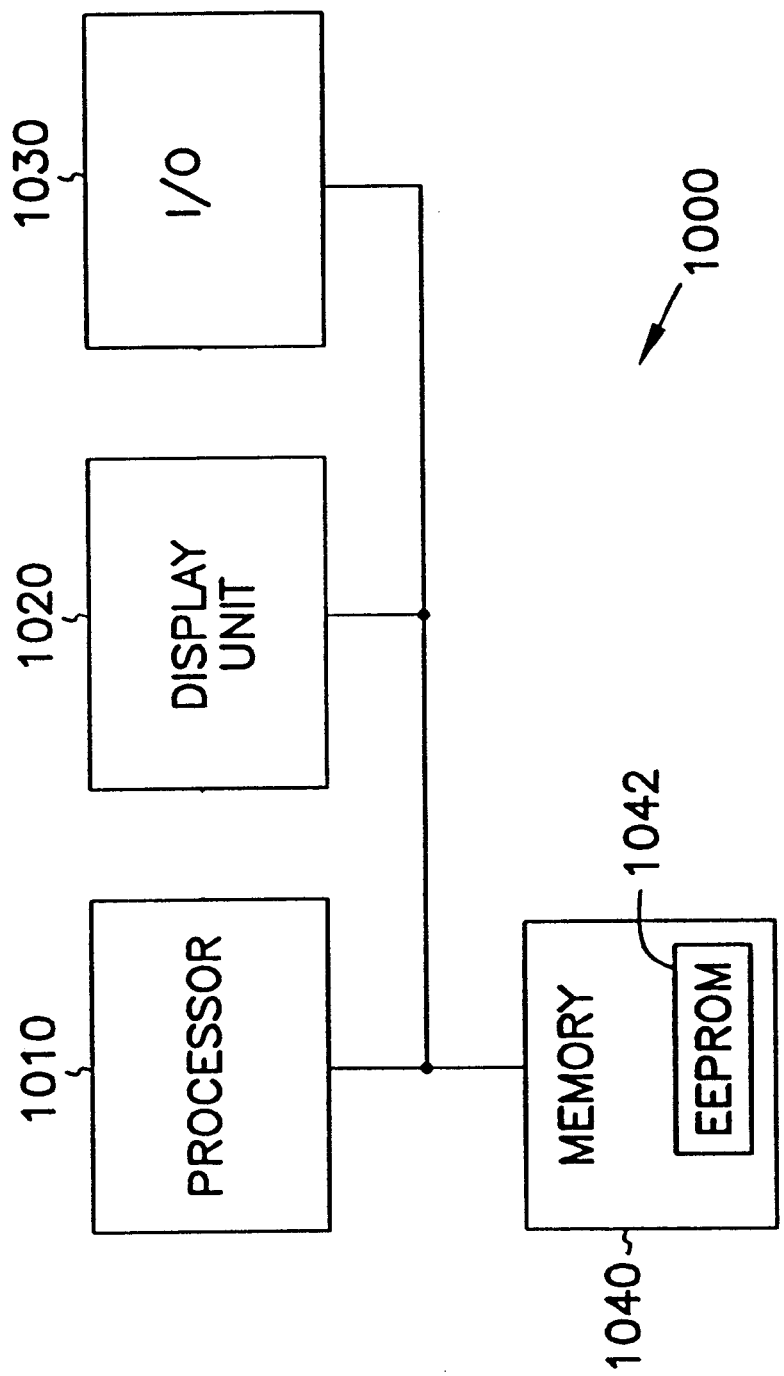
FIG. 10 is a block diagram of an information handling system 1000 according to the present invention.

FIG. 10 is a block diagram of an information-handling system 1000 according to the present invention. System 1000 includes a processor 1010, a display unit 1020, and input/output (I/O) subsystem 1030, and a memory 1040. In various embodiments, system 1000 is a computer system (such as, for example, a video game, a handheld calculator, a personal computer, or a multiprocessor supercomputer), an information appliance (such as, for example, a cellular telephone, a pager, or a daily planner or organizer), an information component (such as, for example, a magnetic disk drive or telecommunications modem), or other appliance (such as, for example, a hearing aid, washing machine or microwave oven having an electronic controller).

In one embodiment of the information-handling system 1000 of FIG. 10, memory 1040 includes an EEPROM circuit 1042 which includes a non-volatile memory transistor built as described in FIGS. 1A–9D above. In one embodiment, memory 1040 in FIG. 10 includes a chip 100 built as described in FIGS. 1A–9D above. In another embodiment, processor 1010 includes a non-volatile memory transistor built as described in FIGS. 1A–9D above. In yet another embodiment, display unit 1020 includes a non-volatile memory transistor built as described in FIGS. 1A–9D above. In still another embodiment, I/O subsystem 1030 includes a non-volatile memory transistor built as described in FIGS. 1A–9D above.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for fabricating an electronic circuit comprising:

forming a first dielectric layer on a first chip area to be used for a first set of transistors, on a second chip area to be used for a second set of transistors, and on a third chip area to be used for a third set of transistors;

substantially removing the first dielectric layer from the second chip area while substantially leaving the first dielectric layer on the first chip area;

forming a second dielectric layer on the second chip area, while thickening the dielectric of the first chip area;

substantially removing all dielectric layer from the third chip area while substantially leaving the dielectric layer on the first chip area and the dielectric layer on the second chip area; and forming a third dielectric layer on the second chip area, while thickening the dielectric of the first chip area and the dielectric layer on the second chip area.

2. The method according to claim 1, wherein the first dielectric layer is thicker than the second dielectric layer, and wherein the first dielectric is a gate oxide for signal transistors, and the second dielectric is a gate oxide for electrically erasable and programmable read only memory (EEPROM) storage transistors.

3. The method according to claim 2, wherein the first chip area and the second chip area are substantially co-planar.

4. A method for fabricating an electronic circuit comprising:
- forming a first dielectric layer on a first chip area to be used for a first set of transistors that are to be used for signalling, and on a second chip area to be used for a second set of transistors, and on a third chip area to be used for a third set of transistors that are to be used for floating-gate memory;
- substantially removing the first dielectric layer from the second chip area while substantially leaving the first dielectric layer on the first chip area; and
- forming a second dielectric layer on the second chip area, while simultaneously thickening the dielectric of the first chip area,
- substantially removing all dielectric layer from the third chip area while substantially leaving the dielectric layer on the first chip area and the dielectric layer on the second chip area; and
- forming a third dielectric layer on the second chip area, while thickening the dielectric of the first chip area and the dielectric layer on the second chip area, wherein the third dielectric layer provides a gate oxide region sufficiently thin to allow Fowler-Nordheim tunneling for programming or erasing.

5. A method for fabricating an electronic circuit comprising:
- forming a first dielectric layer on both a first chip area to be used for a first set of transistors and on a second chip area to be used for a second set of transistors, and on a third chip area to be used for a third set of transistors, wherein the first dielectric layer is a gate oxide sufficiently thick to prevent electrical breakdown at operating voltages to be used for signalling;
- removing the first dielectric layer from the second chip area but not from the first chip area; and
- forming a second dielectric layer on the second chip area to be used for the second set of transistors, while simultaneously thickening the dielectric of the first chip area to be used for the first set of transistors,
- substantially removing all dielectric layer from the third chip area while substantially leaving the dielectric layer on the first chip area and the dielectric layer on the second chip area; and
- forming a third dielectric layer on the second chip area, while thickening the dielectric of the first chip area and the dielectric layer on the second chip area, wherein the third dielectric layer is a gate oxide sufficiently thin to allow Fowler-Nordheim tunneling for programming or erasing; and
- covering the first dielectric layer and the second dielectric layer with a polysilicon layer that becomes a polysilicon transistor gate for transistors in the first chip area and becomes a polysilicon floating gate for transistors in the second chip area.

6. A method for fabricating an electronic circuit comprising:
- forming a dielectric layer on a chip area of a substrate to be used for a set of transistors;
- depositing a floating-gate poly layer over the dielectric layer;
- depositing an inter-poly nitride layer over the floating-gate poly layer;
- depositing a control-gate poly layer over the inter-poly nitride layer;
- depositing a tungsten-silicide (WSix) layer over the control-gate poly layer;
- removing material to form a plurality of stack rows separated by isolation trenches, each of the isolation trenches substantially parallel to a first direction, wherein the isolation trenches extend into the substrate;
- depositing a nitride layer along at least side portions of the rows;
- substantially filling the isolation trenches with an insulator;
- removing material to form a plurality of columns separated by secondary trenches, each of the secondary trenches substantially perpendicular to the first direction, wherein the secondary trenches extend to the substrate; and
- depositing a nitride layer along at least side portions of the rows.

7. A method for fabricating an electronic circuit comprising:
- forming a dielectric layer on a chip area to be used for a set of transistors;
- depositing a floating-gate poly layer over the dielectric layer;
- depositing an inter-poly nitride layer over the floating-gate poly layer;
- depositing a control-gate poly layer over the inter-poly nitride layer;
- depositing a tungsten-silicide (WSix) layer over the control-gate poly layer;
- etching trenches to define a floating-gate stack on a silicon substrate, the stack having a first side that extends into a first trench and a second side that extends into a second trench into the silicon substrate, the stack including the dielectric layer, the floating-gate poly layer, the inter-poly nitride layer, the control-gate poly layer, and the tungsten-silicide (WSix) layer;
- etching the stack to form a drain end and a source end;
- depositing a nitride layer covering the first side from the inter-poly nitride layer to the first trench;
- depositing a nitride layer covering the second side from the inter-poly nitride layer to the second trench;
- depositing a nitride layer covering the drain end from the inter-poly nitride layer to the substrate; and
- depositing a nitride layer covering the source end from the inter-poly nitride layer to the substrate.

8. The method according claim 7, further comprising:
- forming a tungsten drain contact substantially adjacent to the nitride layer covering the drain end;
- forming a tungsten source contact substantially adjacent to the nitride layer covering the source end; and
- forming a tungsten gate contact to substantially contact the WSix layer.

9. The method according claim 8, further comprising:
- forming an aluminum-copper (AlCu) line substantially in contact with the tungsten drain contact.

10. A method for fabricating an electronic circuit comprising:

forming a dielectric layer on a chip area to be used for a set of transistors;

depositing a floating-gate poly layer over the dielectric layer;

depositing an inter-poly nitride layer over the floating-gate poly layer;

depositing a control-gate poly layer over the inter-poly nitride layer;

depositing a tungsten-silicide (WSix) layer over the control-gate poly layer;

etching trenches to define a floating-gate stack on a silicon substrate, the stack having a first side that extends into a first trench and a second side that extends into a second trench into the silicon substrate, the stack including the dielectric layer, the floating-gate poly layer, the inter-poly nitride layer, the control-gate poly layer, and the tungsten-silicide (WSix) layer;

etching the stack to form a drain end and a source end;

depositing a nitride layer covering the first and second side from the inter-poly nitride layer to their respective trenches, and covering the drain end and source ends from the inter-poly nitride layer to the substrate;

forming a tungsten drain contact substantially adjacent to the nitride layer covering the drain end;

forming a tungsten source contact substantially adjacent to the nitride layer covering the source end; and forming a tungsten gate contact to substantially contact the WSix layer.

11. A method for fabricating an electronic circuit, the circuit having a substrate and a floating-gate stack on the substrate, the stack including a gate oxide on the substrate, and at least one poly layer on the gate oxide, the method comprising:

etching a plurality of trenches through the stack, some of the trenches extending into the substrate, and others of the trenches stopping substantially at a top surface of the substrate; and depositing a nitride spacer layer on sides of the trenches.

12. The method according claim 11, wherein the nitride spacer layer is deposited to isolate all sides of a floating gate poly layer.

13. The method according claim 11, wherein the etching of the plurality of trenches comprises etching a first plurality of substantially parallel trenches through the stack into the substrate, the depositing of the nitride spacer layer comprises depositing nitride on sides of the first plurality of parallel trenches, the etching of the plurality of trenches further comprises etching a second plurality of substantially parallel trenches substantially perpendicular to the first plurality of substantially parallel trenches and the depositing of the nitride spacer layer further comprises depositing nitride on sides of the second plurality of parallel trenches.

14. The method according claim 13, wherein the stack includes two poly layers separated by an inter-poly dielectric layer, and wherein the nitride spacer layer covers the sides of both poly layers and the sides of the inter-poly dielectric layer.

15. A method for fabricating an electronic circuit, the circuit having a substrate, a gate oxide on the substrate, a floating-gate poly layer on the gate oxide, an inter-poly nitride layer on the floating gate poly layer, a control-gate poly layer on the inter-poly nitride layer; a tungsten-silicide (WSix) layer on the control-gate poly layer, and a nitride cap layer on the WSix layer; the method comprising:

etching a plurality of isolation trenches along a first direction through the stack into the substrate;

depositing a nitride spacer layer on sides of the isolation trenches;

further etching to remove the nitride cap and to further deepen the plurality of isolation trenches into the substrate;

filling the isolation trenches with tetraethylorthosilicate (TEOS);

covering an area of the circuit with planarized borophosphosilicate glass (BPSG);

etching lines along a second direction substantially perpendicular to the isolation trenches;

depositing a nitride spacer layer on sides of the lines;

covering the area of the circuit with a thin TEOS layer;

covering the area of the circuit with planarized BPSG;

etching trenches through the TEOS layer between adjacent transistors to the substrate and on portions of adjacent transistor areas to the WSix layer, using an etch that does not substantially etch nitride;

depositing a titanium or titanium nitride barrier layer;

filling the trench with tungsten;

chemical-mechanical polishing (CMP) to planarize and remove tungsten and upper portions of oxide, stopping near tops of the nitride spacers;

covering with BPSG, etching contacts through contact areas, depositing barrier layer in the contact areas, depositing tungsten in the contact areas, and chemical-mechanical polishing (CMP) back the tungsten to leave only the tungsten in the contact areas; and depositing aluminum copper (ALCU), etching interconnects, and covering with a passivation layer.

16. A method for fabricating an electronic circuit on a wafer comprising:

depositing a dielectric layer on a substrate of the wafer the dielectric layer having a first thickness in a first area of the circuit and a second thickness, thinner than the first thickness, in a second area of the circuit;

depositing a first poly gate layer over the dielectric layer;

depositing an inter-poly dielectric layer over the first poly layer;

removing the inter-poly dielectric from the first area but not from the second area; and depositing a second poly gate layer over the inter-poly dielectric layer in the second area and on the first poly layer in the first area, wherein the second poly gate layer forms a control gate for a memory cell in the second area of the circuit.

17. The method according claim 16, further comprising:

depositing a tungsten-silicide (WSix) layer over the second poly gate layer to reduce contact resistance.

18. The method according claim 16, further comprising:

depositing a gate-signal-connection layer that forms electrical contacts to the first poly gate layer in an area in which the inter-poly dielectric and the second poly gate layers were removed, and to the second poly gate layer in an area in which the inter-poly dielectric and the second poly gate layers were not removed.

19. A method for fabricating an electronic circuit on a wafer comprising:

depositing a dielectric layer on a substrate of the wafer;

depositing a first poly gate layer over the dielectric layer;

depositing an inter-poly dielectric layer over the first poly layer;

depositing a second poly gate layer over the inter-poly dielectric layer;

removing the inter-poly dielectric and the second poly gate layer from some but not all of the first poly gate layer;

depositing a gate-signal-connection layer that forms electrical contacts to the first poly gate layer in an area in which the inter-poly dielectric and the second poly gate layers were removed, and to the second poly gate layer in an area in which the inter-poly dielectric and the second poly gate layers were not removed.

20. A method of fabricating an electronic circuit comprising:

forming a first dielectric layer on a first chip area to be used for a first set of transistors and on a second chip area to be used for a second set of transistors and on a third chip area to be used for a third set of transistors;

substantially removing the first dielectric layer from at least the second chip area while substantially leaving the first dielectric layer on the first chip area;

forming a second dielectric layer on the second chip area, while thickening the dielectric of the first chip area;

substantially removing any dielectric layer from the third chip area while substantially leaving the dielectric layer on the first chip area and the dielectric layer on the second chip area; and forming a third dielectric layer on the third chip area, while thickening the dielectric of the first chip area and the dielectric layer of the second chip area.

21. The method according to claim 20, wherein the first dielectric is a gate oxide for signal transistors, and the third dielectric is a gate oxide for electrically erasable and programmable read only memory (EEPROM) storage transistors.

22. The method according to claim 21, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer; and depositing a tungsten-silicide (WSix) layer over the control-gate polysilicon layer.

23. The method according to claim 20, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack on a silicon substrate, the stack having a first side that extends into a first trench and a second side that extends into a second trench into the silicon substrate, the stack including the third dielectric layer, the floating-gate poly layer, the inter-poly nitride layer, the control-gate poly layer, and the tungsten-silicide (WSix) layer;

etching the stack to form a drain end and a source end;

depositing a nitride layer covering the first side from the inter-poly nitride layer to the first trench;

depositing a nitride layer covering the second side from the inter-poly nitride layer to the second trench;

depositing a nitride layer covering the drain end from the inter-poly nitride layer to the substrate; and depositing a nitride layer covering the source end from the inter-poly nitride layer to the substrate.

24. The method according to claim 20, comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack; and depositing a nitride spacer layer on sides of the trenches to isolate all sides of the floating gate polysilicon layer.

25. A method of fabricating an electronic circuit comprising:

forming a first dielectric layer on a first chip area to be used for a first set of transistors and on a second chip area to be used for a second set of transistors and on a third chip area to be used for a third set of transistors;

substantially removing the first dielectric layer from at least the second chip area while substantially leaving the first dielectric layer on the first chip area;

forming a second dielectric layer on the second chip area, while simultaneously thickening the dielectric of the first chip area, substantially removing any dielectric layer from the third chip area while substantially leaving the dielectric layer on the first chip area and the dielectric layer on the second chip area; and forming a third dielectric layer on the third chip area, while thickening the dielectric of the first chip area and the dielectric layer of the second chip area; wherein the third dielectric layer provides a gate oxide region sufficiently thin to allow Fowler-Nordheim tunneling for at least one of programming and erasing.

26. The method according to claim 25, wherein the first dielectric is a gate oxide for signal transistors, and the third dielectric is a gate oxide for electrically erasable and programmable read only memory (EEPROM) storage transistors.

27. The method according to claim 26, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer; and depositing a tungsten-silicide (WSix) layer over the control-gate polysilicon layer.

28. The method according to claim 25, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack on a silicon substrate, the stack having a first side that extends into a first trench and a second side that extends into a second trench into the silicon substrate, the stack including the third dielectric layer, the floating-gate poly layer, the inter-poly nitride layer, the control-gate poly layer, and the tungsten-silicide (WSix) layer;

etching the stack to form a drain end and a source end;

depositing a nitride layer covering the first side from the inter-poly nitride layer to the first trench;

depositing a nitride layer covering the second side from the inter-poly nitride layer to the second trench;

depositing a nitride layer covering the drain end from the inter-poly nitride layer to the substrate; and depositing a nitride layer covering the source end from the inter-poly nitride layer to the substrate.

29. The method according to claim 25, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack; and depositing a nitride spacer layer on sides of the trenches to isolate all sides of the floating gate polysilicon layer.

30. A method of fabricating an electronic circuit comprising:

forming a first dielectric layer on a first chip area to be used for a first set of transistors and on a second chip area to be used for a second set of transistors and on a third chip area to be used for a third set of transistors;

removing the first dielectric layer from the second chip area but not from the first chip area; and forming a second dielectric layer on the second chip area to be used for the second set of transistors, while simultaneously thickening the dielectric of the first chip area to be used for the first set of transistors, substantially removing any dielectric layer from the third chip area while substantially leaving the dielectric layer on the first chip area and the dielectric layer on the second chip area; and forming a third dielectric layer on the third chip area, while thickening the dielectric of the first chip area and the dielectric layer of the second chip area; wherein the third dielectric layer is a gate oxide sufficiently thin to allow Fowler-Nordheim tunneling for programming or erasing; and covering the first dielectric layer and the third dielectric layer with a polysilicon layer that becomes a polysilicon transistor gate for transistors in the first chip area and becomes a polysilicon floating gate for transistors in the third chip area.

31. The method according to claim 30, wherein the first dielectric is a gate oxide for signal transistors, and the third dielectric is a gate oxide for electrically erasable and programmable read only memory (EEPROM) storage transistors.

32. The method according to claim 31, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer; and depositing a tungsten-silicide (WSix) layer over the control-gate polysilicon layer.

33. The method according to claim 30, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack on a silicon substrate, the stack having a first side that extends into a first trench and a second side that extends into a second trench into the silicon substrate, the stack including the third dielectric layer, the floating-gate poly layer, the inter-poly nitride layer, the control-gate poly layer, and the tungsten-silicide (WSix) layer;

etching the stack to form a drain end and a source end;

depositing a nitride layer covering the first side from the inter-poly nitride layer to the first trench;

depositing a nitride layer covering the second side from the inter-poly nitride layer to the second trench;

depositing a nitride layer covering the drain end from the inter-poly nitride layer to the substrate; and depositing a nitride layer covering the source end from the inter-poly nitride layer to the substrate.

34. The method according to claim 30, further comprising:

depositing a floating-gate polysilicon layer over the third dielectric layer;

depositing an inter-poly nitride layer over the floating-gate polysilicon layer;

depositing a control-gate polysilicon layer over the inter-poly nitride layer;

depositing a tungsten-silicide (WSix) layer over the control-gate polysilicon layer;

etching trenches to define a floating-gate stack; and depositing a nitride spacer layer on sides of the trenches to isolate all sides of the floating gate polysilicon layer.

35. The method according to claim 30, further comprising:

connecting the floating-gate stack as an electrically-erasable memory; and operably connecting the electrically-erasable memory to a microprocessor.

36. The method according to claim 30, further comprising:

connecting the floating-gate stack as an electrically-erasable memory; and operably connecting the electrically-erasable memory to a microprocessor.

37. A method of fabricating an electronic circuit comprising:

forming a first dielectric layer on a first chip area to be used for a first set of transistors and on a second chip area to be used for a second set of transistors and on a third chip area to be used for a third set of transistors;

substantially removing the first dielectric layer from the second chip area while substantially leaving the first dielectric layer on the first chip area; and forming a second dielectric layer on the second chip area, while thickening the dielectric of the first chip area, wherein the first dielectric layer is thicker than the second dielectric layer, wherein the first dielectric is a gate oxide for signal transistors, and the second dielectric is a gate oxide for electrically erasable and programmable read only memory (EEPROM) storage transistors that are formed by:

depositing a floating-gate poly layer over the second dielectric layer;

depositing an inter-poly nitride layer over the floating-gate poly layer;

depositing a control-gate poly layer over the inter-poly nitride layer;

depositing a tungsten-silicide (WSix) layer over the control-gate poly layer;

etching trenches to define a floating-gate stack on a silicon substrate, the stack having a first side that extends into a first trench and a second side that extends into a second trench into the silicon substrate, the stack including the second dielectric layer, the floating-gate poly layer, the inter-poly nitride layer, the control-gate poly layer, and the tungsten-silicide (WSix) layer;

etching the stack to form a drain end and a source end;

depositing a nitride layer covering the first and second side from the inter-poly nitride layer to their respective trenches, and covering the drain end and source ends from the inter-poly nitride layer to the substrate;

forming a tungsten drain contact substantially adjacent to the nitride layer covering the drain end;

forming a tungsten source contact substantially adjacent to the nitride layer covering the source end; and forming a tungsten gate contact to substantially contact the WSix layer.

38. A method for fabricating an electronic circuit on a wafer comprising:

depositing a dielectric layer on a substrate of the wafer;

depositing a first poly gate layer over the dielectric layer;

depositing an inter-poly dielectric layer over the first poly layer;

depositing a second poly gate layer over the inter-poly dielectric layer;

removing the inter-poly dielectric and the second poly gate layer from some but not all of the first poly gate layer;

depositing a tungsten-silicide (WSix) layer over at least the second poly gate layer to reduce contact resistance; and depositing a gate-signal-connection layer that forms electrical contacts to the first poly gate layer in an area in which the inter-poly dielectric and the second poly gate layers were removed, and to the second poly gate layer in an area in which the inter-poly dielectric and the second poly gate layers were not removed.

39. A method for fabricating an electronic circuit on a wafer comprising:

depositing a dielectric layer on a substrate of the wafer;

depositing a first poly gate layer over the dielectric layer;

depositing an inter-poly dielectric layer over the first poly layer;

removing the inter-poly dielectric from a first chip area but not from a second chip area; and depositing a second poly gate layer over the inter-poly dielectric layer in the second chip area, and on the first poly gate layer in the first chip area, wherein the second poly gate layer forms a control gate for a memory cell in the second chip area.

40. The method according claim 39, further comprising:

depositing a tungsten-silicide (WSix) layer over the second poly gate layer to reduce contact resistance.

41. The method according claim 39, further comprising:

depositing a gate-signal-connection layer that forms electrical contacts to the first poly gate layer in the first chip area, and to the second poly gate layer in the second chip area.

\* \* \* \* \*

UNITED STATES PATENT AND TRADEMARK OFFICE
CERTIFICATE OF CORRECTION

PATENT NO. : 6,551,878 B2  Page 1 of 1
DATED : April 22, 2003
INVENTOR(S) : Clampitt et al.

It is certified that error appears in the above-identified patent and that said Letters Patent is hereby corrected as shown below:

Column 1,
Line 12, delete "5,657,287" and insert -- 5,675,287 --, therefor.
Line 13, delete "428" and insert -- 438 --, therefor.
Line 15, delete "Kauffam" and insert -- Kauffman --, therefor.

Column 18,
Line 11, after "claim 20," insert -- further --.

Signed and Sealed this

Fifteenth Day of July, 2003

JAMES E. ROGAN
*Director of the United States Patent and Trademark Office*